(12) United States Patent
Leobandung

(10) Patent No.: US 10,580,900 B2
(45) Date of Patent: Mar. 3, 2020

(54) NANOSHEET CHANNEL POST REPLACEMENT GATE PROCESS

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/874,965

(22) Filed: Jan. 19, 2018

(65) Prior Publication Data

US 2019/0229218 A1 Jul. 25, 2019

(51) Int. Cl.

| | |
|---|---|
| H01L 29/786 | (2006.01) |
| H01L 29/06 | (2006.01) |
| H01L 29/20 | (2006.01) |
| H01L 21/8234 | (2006.01) |
| H01L 29/78 | (2006.01) |
| H01L 21/84 | (2006.01) |
| H01L 29/49 | (2006.01) |
| B82Y 10/00 | (2011.01) |
| H01L 29/10 | (2006.01) |

(Continued)

(52) U.S. Cl.
CPC ........ *H01L 29/78618* (2013.01); *B82Y 10/00* (2013.01); *H01L 21/823412* (2013.01); *H01L 21/845* (2013.01); *H01L 29/0653* (2013.01); *H01L 29/0673* (2013.01); *H01L 29/0676* (2013.01); *H01L 29/1079* (2013.01); *H01L 29/20* (2013.01); *H01L 29/42392* (2013.01); *H01L 29/4908* (2013.01); *H01L 29/66469* (2013.01); *H01L 29/775* (2013.01); *H01L 29/785* (2013.01); *H01L 29/78681* (2013.01); *H01L 29/78696* (2013.01)

(58) Field of Classification Search
CPC ........ H01L 29/78696; H01L 29/78618; H01L 21/845; H01L 29/78681; H01L 29/0653; H01L 29/0676; H01L 29/785
See application file for complete search history.

(56) References Cited

U.S. PATENT DOCUMENTS

| | | |
|---|---|---|
| 7,928,427 B1 | 4/2011 | Chang |
| 8,148,218 B2 | 4/2012 | Chang |
| (Continued) | | |

OTHER PUBLICATIONS

Deshpande et al., "Advanced 3D Monolithic Hybrid CMOS with Sub-50 nm Gate Inverters Featuring Replacement Metal Gate (RMG)-InGaAs nFETs on SiGe-OI Fin pFETs," IEEE, 2015, 4 pages.

(Continued)

*Primary Examiner* — Thanh Y. Tran
(74) *Attorney, Agent, or Firm* — Patterson + Sheridan, LLP

(57) ABSTRACT

Device and method for fabricating a field effect transistor (FET) include forming plurality of dummy dielectric layers separated by a corresponding plurality of source/drain regions overlying a substrate. One or more nanosheets of active transistor channels alternating between the plurality of dummy dielectric layers are formed extending at least part way into the plurality of source/drain regions. A high-k dielectric layer is formed about and overlying the source/drain regions and portions of the one or more nanosheets not covered by the plurality of dummy dielectric layers. A conductive metal cap layer is formed overlying the high-k dielectric layer.

12 Claims, 25 Drawing Sheets

(51) Int. Cl.
  *H01L 29/423* (2006.01)
  *H01L 29/66* (2006.01)
  *H01L 29/775* (2006.01)

(56) References Cited

U.S. PATENT DOCUMENTS

| | | |
|---|---|---|
| 8,653,560 B2 | 2/2014 | Tatsumura et al. |
| 9,059,267 B1 | 6/2015 | Majumdar et al. |
| 9,165,835 B2 | 10/2015 | Yeh et al. |
| 9,425,291 B1 | 8/2016 | Balakrishnan et al. |
| 9,461,114 B2 | 10/2016 | Obradovic et al. |
| 9,496,184 B2 | 11/2016 | Chang et al. |
| 9,496,379 B2 | 11/2016 | Leobandung |
| 9,722,022 B2 | 8/2017 | Leobandung et al. |
| 2014/0197371 A1 | 7/2014 | Leobandung et al. |
| 2016/0020305 A1 | 1/2016 | Obradovic et al. |
| 2016/0071968 A1 | 3/2016 | Leobandung et al. |
| 2017/0256611 A1* | 9/2017 | Kim .................... H01L 29/0673 |
| 2019/0035888 A1* | 1/2019 | Wu .................... H01L 29/0673 |
| 2019/0067452 A1* | 2/2019 | Cheng ............... H01L 29/66666 |

OTHER PUBLICATIONS

Djara et al, "CMOS-Compatible Replacement Metal Gate InGasAs-OI FinFET with Ion=156," IEEE Electron Device Letters, vol. 37, No. 2, Feb. 2016, 4 pages.

Deshpande, et al, "First RF Characterization of InGasAs Replacement Metal Gate (RMG) nFETS on SiGe-OI FinFETs Fabricated by 3D Monolithic Integration," Eurosoi-ulis, 2016, 4 pages.

* cited by examiner

NANOSHEET CHANNEL POST REPLACEMENT GATE PROCESS

BACKGROUND

The present invention relates to field effect transistor (FET), and more particularly, to an FET and method of manufacturing same from nanosheets.

The FET is a transistor used for amplifying or switching electronic signals. The FET has a source, a drain, and a metal oxide gate electrode. The metal gate is electrically insulated from the main semiconductor n-channel or p-channel by a thin layer of insulating material, for example, silicon dioxide or glass, which makes the input resistance of the FET relatively high. The gate voltage controls whether the path from drain to source is an open circuit ("off") or a resistive path ("on").

N-type field effect transistors (nFET) and p-type field effect transistors (pFET) are two types of complementary FETs. The nFET uses electrons as the current carriers and with n-doped source and drain junctions. The pFET uses holes as the current carriers and with p-doped source and drain junctions.

FETs have been manufactured from nanosheets. A nanosheet is a structure having a diameter in the order of a nanometer. Nanowires promise to be the next device structure to allow device scaling. However, nanosheets are very difficult to manufacture due to their three-dimensional nature. While several solutions have been proposed, these solutions may include a number of drawbacks. For example, the proposed solutions may include a non-manufacturable process or the fabricated nanosheet may have a high parasitic capacitance.

Nanosheets of III-V semiconductor materials can be grown on Si (111) or other crystal orientation opening perpendicular to the seed opening. Therefore, it is desirable to grown III-V FET transistor structures using nanosheets.

SUMMARY

According to one embodiment of the present invention, a method for fabricating a field effect transistor (FET) includes forming plurality of dummy dielectric layers separated by a corresponding plurality of source/drain regions overlying a substrate. One or more nanosheets of active transistor channels alternating between the plurality of dummy dielectric layers are formed extending at least part way into the plurality of source/drain regions. A high-k dielectric layer is formed about and overlying the source/drain regions and portions of the one or more nanosheets not covered by the plurality of dummy dielectric layers. A conductive metal cap layer is formed overlying the high-k dielectric layer.

A semiconductor device includes a substrate. A plurality of dummy dielectric layers separated by a corresponding plurality of source/drain regions are formed overlying the substrate. One or more nanosheets of active transistor channels are formed alternating between the plurality of dummy dielectric layers and extending at least part way into the plurality of source/drain regions. A high-k dielectric layer is formed about and overlying the source/drain regions and portions of the one or more nanosheets not covered by the plurality of dummy dielectric layers. A conductive metal cap layer is formed overlying the high-k dielectric layer.

DETAILED DESCRIPTION

Figure 1A:
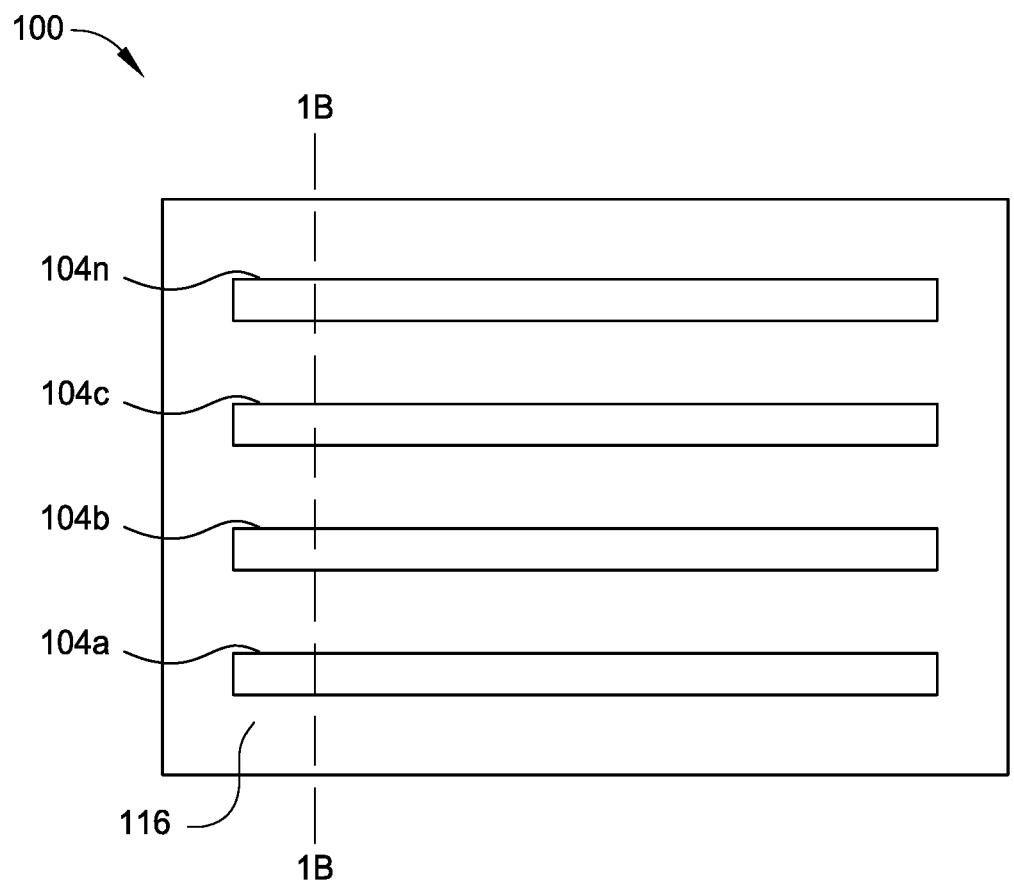
FIG. 1A is a top-down view of a semiconductor device illustratively depicted in accordance with one embodiment.

In accordance with the present disclosure, a method and a device are provided for fabricating an improved field effect transistor is disclosed. The method includes forming a plurality of dummy dielectric layers separated by a corresponding plurality of source/drain regions overlying a substrate. One or more nanosheets of active transistor channels are formed alternating between the plurality of dummy dielectric layers and extending at least part way into the plurality of source/drain regions. A high-k dielectric layer is formed about and overlying the source/drain regions and portions of the one or more nanosheets not covered by the plurality of dummy dielectric layers. A conductive metal cap layer is formed overlying the high-k dielectric layer.

The method may further comprise forming a plurality of etch stop layers overlying the substrate and underlying and aligned with the plurality of dummy layers. Forming the plurality of etch stop layers comprises forming a plurality of fin structures overlying the substrate.

The method may further comprise forming a shallow trench isolation (STI) layer overlying a surface of the substrate proximal to but not including the fin structures, forming a plurality of dummy gates overlying a portion of the fin structures, removing the plurality of dummy gates to form first recesses, and etching portions of the fin structures to form second recesses overlying remaining portions of the fin structures to form the channel stop layers.

The one or more nanosheets of active transistor channels are grown within and between the first recesses left by the removed dummy gates. The one or more nanosheets are aligned in a (111) orientation of the substrate. The one or more nanosheets may be made of a material, which may include InGaAs. The one or more nanosheets of active transistor channels may be epitaxially grown.

The method may further comprise forming a plurality of dielectric spacers along sidewalls of the source/drain regions. The method may further comprise forming metal contacts in recesses overlying the source/drain regions.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1B:
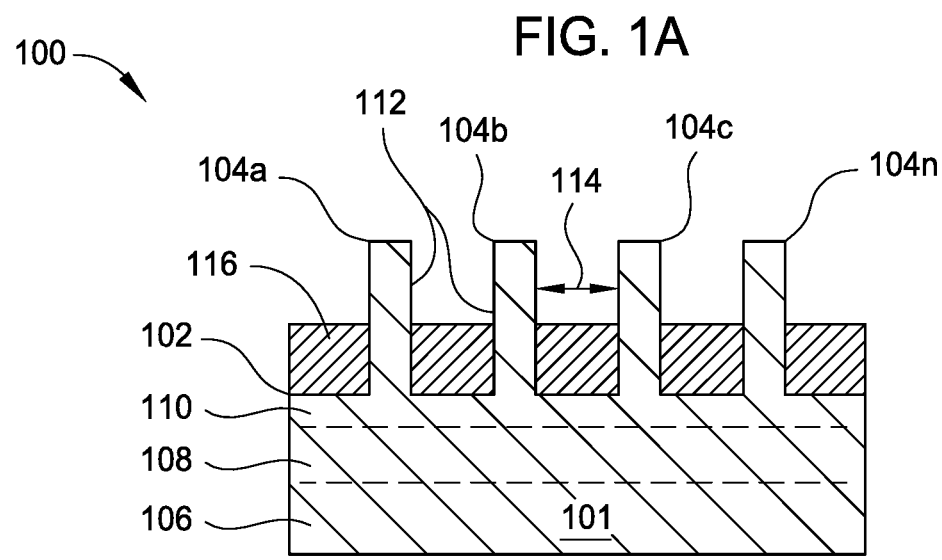
FIG. 1B shows a cross-sectional view taken at section line 1B of FIG. 1A.

Referring now to the drawings in which like numerals represent the same or similar elements and initially to FIG. 1A, a top-down view of a semiconductor device 100 is illustratively depicted in accordance with one embodiment. FIG. 1B shows a cross-sectional view of the semiconductor device 100 of FIG. 1A. Referring to FIGS. 1A and 1B, a plurality of fin structures 104a-104n are formed over a principal surface 102. The principle surface 102 may be a top surface of a silicon-on-insulator (SOI) substrate 101 that includes a base substrate 106, a buried oxide layer (BOX), and a semiconductor layer 110. According to an embodiment of the present invention, the material of a base substrate 106 is silicon. Overlaying the base substrate 106 is a buried-oxide layer (BOX) layer 108. Atop the BOX layer 108 is a semiconductor layer 110. According to an embodiment, the semiconductor layer 110 material is silicon (Si).

The base substrate 106 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 106 may be about, but is not limited to, several hundred microns thick. For example, the base substrate 106 may include a thickness ranging from 0.5 mm to about 1.5 mm.

The BOX layer 108 may be formed from any of several known dielectric materials. Non-limiting examples include, for example, oxides, nitrides and oxynitrides of silicon. Oxides, nitrides and oxynitrides of other elements are also envisioned. In addition, the BOX layer 108 may include crystalline or non-crystalline dielectric material. Moreover, the BOX layer 108 may be formed using any of several known methods. Non-limiting examples include ion implantation methods, thermal or plasma oxidation or nitridation methods, chemical vapor deposition methods and physical vapor deposition methods. Alternatively, the BOX layer 108 may include a thickness ranging from about 10 nm to about 500 nm. In one embodiment, the BOX layer 108 may be about 150 nm thick.

The semiconductor layer 110 may include any of the several semiconductor materials included in the base substrate 106. In general, the base substrate 106 and the semiconductor layer 110 may include either identical or different semiconductor materials with respect to chemical composition, dopant concentration and crystallographic orientation. The semiconductor layer 110 may include a thickness ranging from about 5 nm to about 100 nm that may be entirely consumed during patterning of fin structures 104a-104n. Methods for forming the semiconductor layer 110 are well known in the art. Non-limiting examples include SIMOX (Separation by Implantation of Oxygen), wafer bonding, and ELTRAN® (Epitaxial Layer TRANsfer).

In another example, the SOI substrate 101 may be replaced with a bulk semiconductor substrate 101. The term "bulk" used in conjunction with the phrase "bulk semiconductor substrate 101 denotes a substrate that is entirely composed of one or more semiconductor materials. The term "semiconductor" as used herein in connection with the term "bulk semiconductor substrate 101 denotes any material that exhibits semiconductor properties including, for example, Si, Ge, SiGe, SiC, SiGeC, a II/VI compound semiconductor or a III/V compound semiconductor such as, for example, InAs, GaAs, or InP. In one embodiment, the bulk semiconductor substrate 101 may be entirely comprised of silicon. In another embodiment, at least an upper semiconductor material portion of the bulk semiconductor substrate 101 comprises silicon. The crystal orientation of the bulk semiconductor substrate 101 may be {100}, {110}, or {111}. Other crystallographic orientations besides those specifically mentioned can also be used in the present application. At least the upper semiconductor material portion of the bulk semiconductor substrate 100 is a crystalline semiconductor such as, for example, single crystalline silicon.

FIGS. 1A and 1B also show the semiconductor device 100 after forming of fin structures 104a-104n from the initial SOI substrate 101. The fin structures 104a-104n each include a pair of vertical sidewalls 112 that are parallel to each other. As used herein, a surface is "vertical" if there exists a vertical plane from which the surface does not deviate by more than three times the root mean square roughness of the surface. In one embodiment of the present application, each of the fin structures 104a-104n may have a width from about 3 nm to 10 nm; the height of each of the fin structures 104a-104n may be about 50 nm. Other widths and heights that are lesser than, or greater than the ranges mentioned herein can also be used in the present application. Each of the fin structures 104a-104n can be separated by a gap 114 that has a width, w1, from 20 nm to 50 nm.

Each of the fin structures 104a-104n may be formed utilizing a patterning process. In one embodiment, the patterning process used to define each of the fin structures 104a-104n may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the present application, the etch stops on a surface of the BOX layer 108.

Overlying the semiconductor layer 110 is a shallow trench isolation (STI) silicon dioxide layer 116. STI, also known as box isolation technique, is an integrated circuit feature which prevents electric current leakage between adjacent semiconductor device components. The key steps of the STI process involve etching a pattern of trenches in the silicon, depositing one or more dielectric materials (such as silicon dioxide) to fill the trenches, and removing the excess dielectric using a technique such as chemical-mechanical planarization.

Figure 2A:
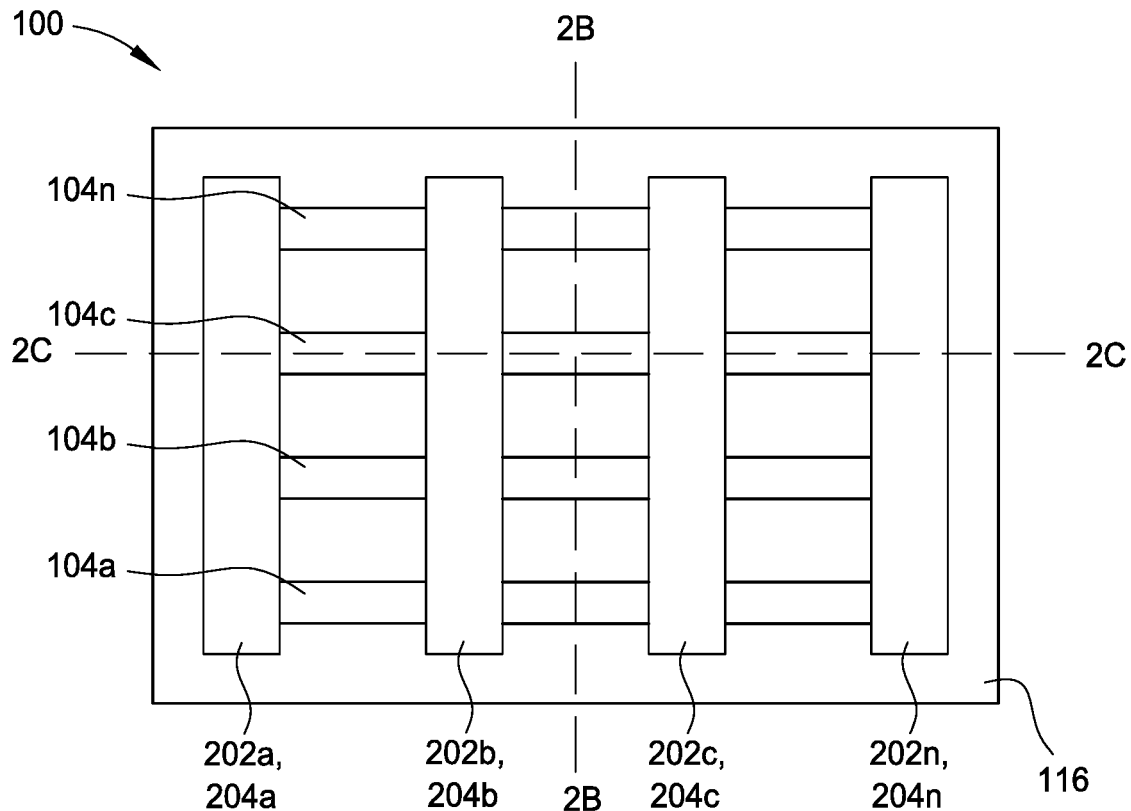
FIG. 2A is a top view of the semiconductor device of FIG. 1A after forming dummy gates overlying a portion of fin structure and an STI layer 116.
Figure 2B:
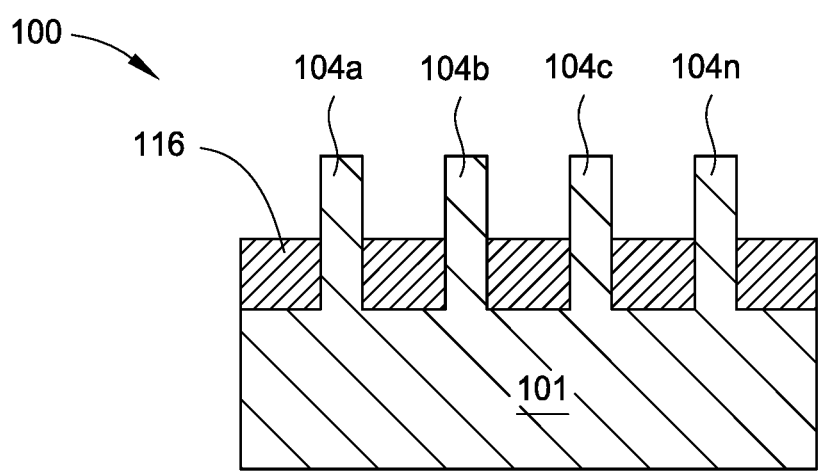
FIG. 2B is a cross-sectional view taken at section line 2B of FIG. 2A.
Figure 2C:
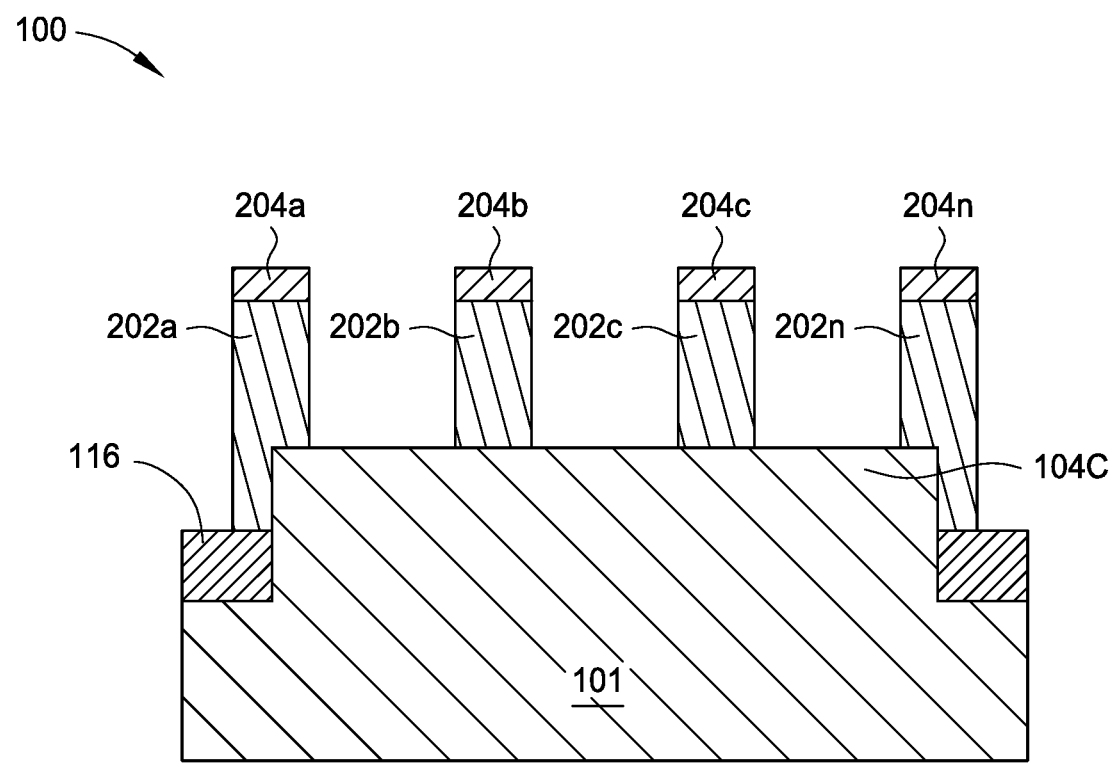
FIG. 2C is a cross-sectional view taken at section line 2C of FIG. 2A.

FIGS. 2A-2C are views of the semiconductor device 100 of FIG. 1A after forming dummy gates 202a-202n overlying a portion of the fin structure 104a-104n and the STI layer 116. FIG. 2B is a cross-sectional view taken at section line A of FIG. 2A, wherein dummy gates 202a-202n (also referred to as a plurality of dummy dielectric layers 202a-202n) are formed of a thin silicon dioxide layer. FIG. 2C is a cross-sectional view taken at section line B of FIG. 2A, wherein dummy gates 202a-202n are formed of a hard mask silicon nitride layer. The dummy gates 202a-202n may be formed by any suitable deposition method known in the art, for example, by chemical vapor deposition (CVD), plasma-enhanced chemical vapor deposition (PECVD), high-density CVD (HDCVD), physical vapor deposition (PVD), plating, sputtering, evaporation, and chemical solution deposition of a dielectric material. In one embodiment, the dummy gates 202a-202n may include a high-k dielectric material having a dielectric constant greater than, for example, 3.9, which is the dielectric constant of silicon oxide.

In an embodiment, a hard mask layer 204-204n may be formed overlying each of the dummy gates 202a-202n using any suitable deposition technique. In an example, the deposition technique may be chemical vapor deposition. In an example, the hard mask layers may be made of a nitride of Silicon material.

Figure 3A:
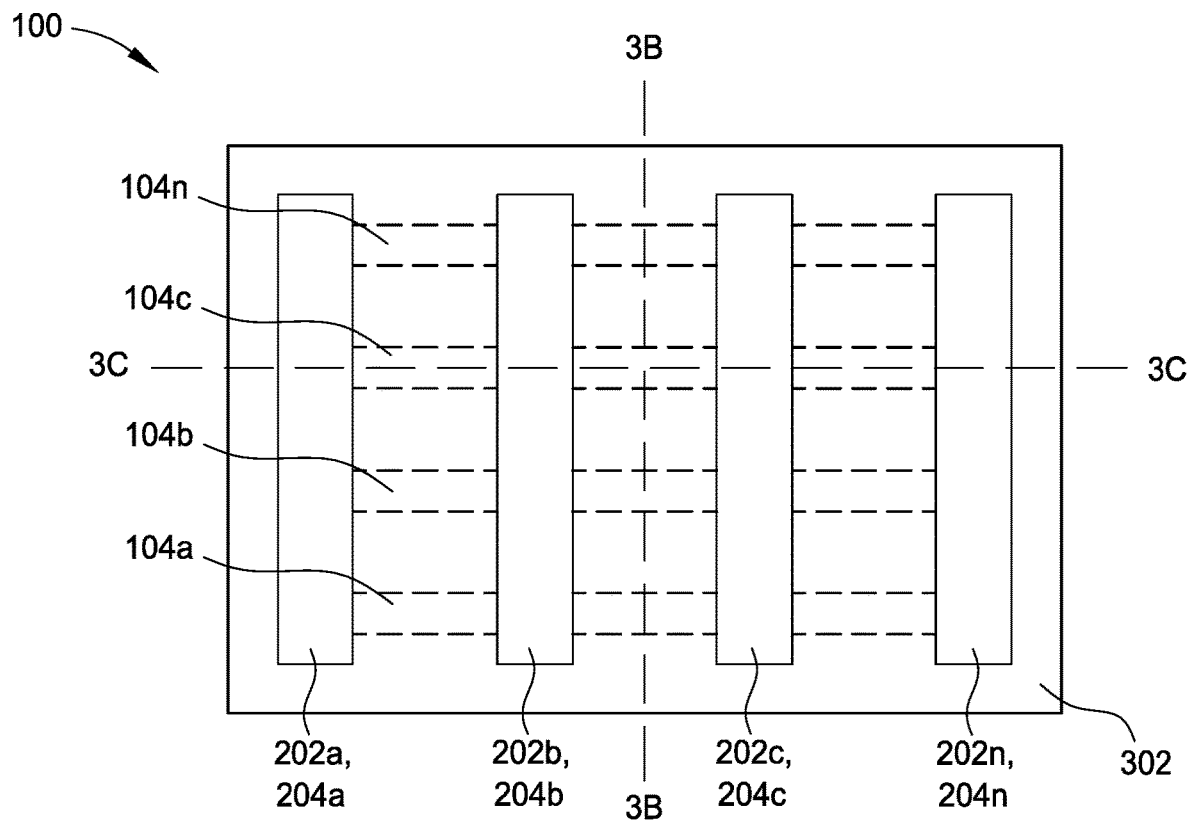
FIG. 3A is a top view of the semiconductor device of FIG. 2A after filling gaps between and adjacent to the fin structures and overlying exposed portions of the semiconductor layer with a dielectric material.
Figure 3B:
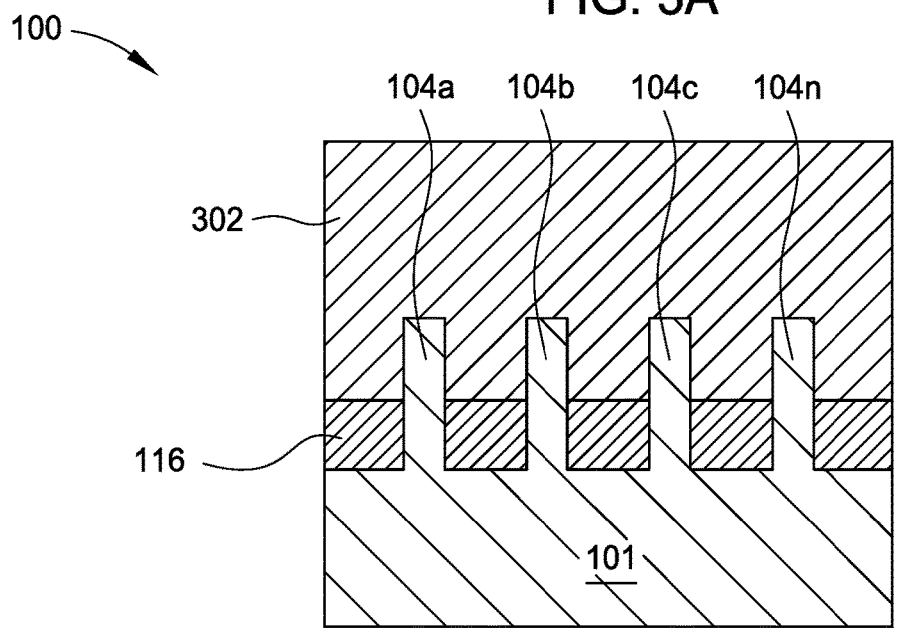
FIG. 3B is a cross-sectional view taken at section line 3B of FIG. 3A.
Figure 3C:
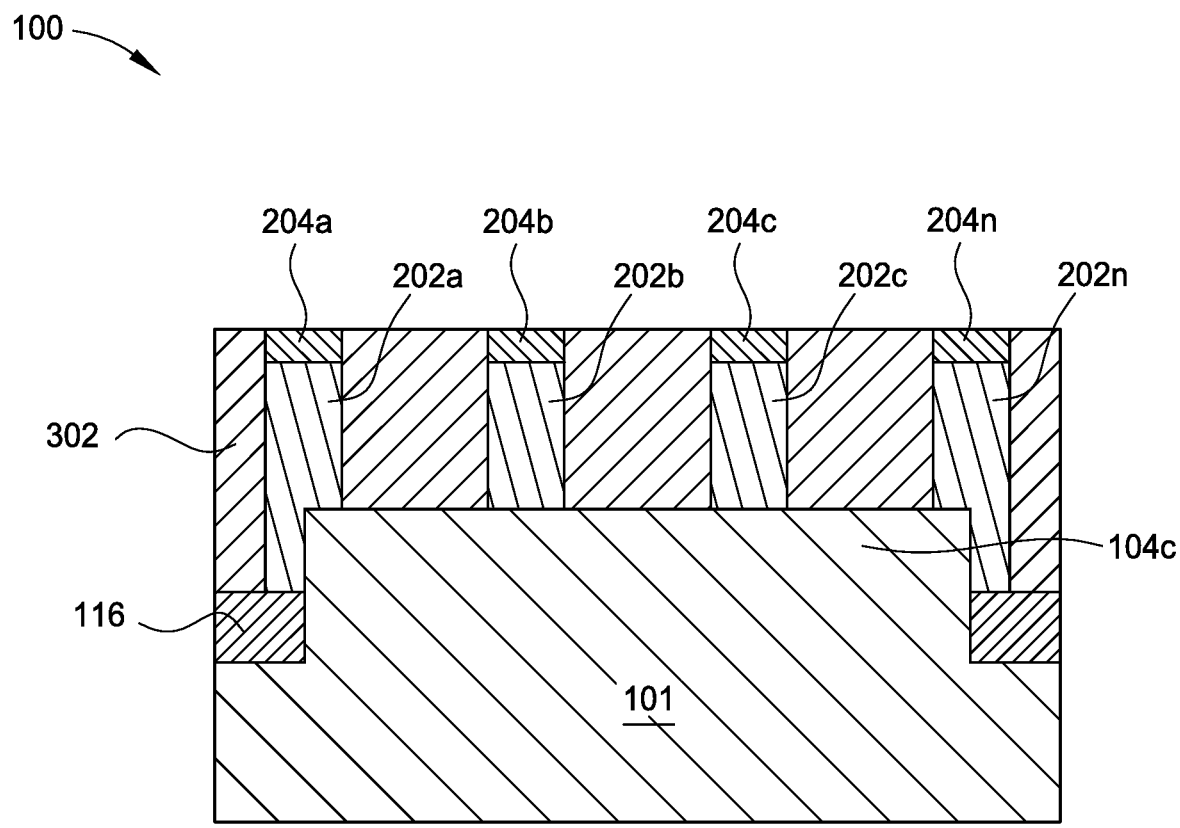
FIG. 3C is a cross-sectional view taken at section line 3C of FIG. 3A.

FIGS. 3A-3C are views of the semiconductor device 100 of FIG. 2A after filling gaps between and adjacent to the fin structures 104a-104n and overlying exposed portions of the STI layer 116 with a dielectric material 302. Following the deposition of the dielectric material 302, a planarization process such as, for example, chemical mechanical polishing may be performed to reduce the height of the dielectric material 302 to be coplanar with the height of the dummy gates 202a-202n. In an example, the planarized dielectric material may be made of an oxide of silicon.

Figure 4A:
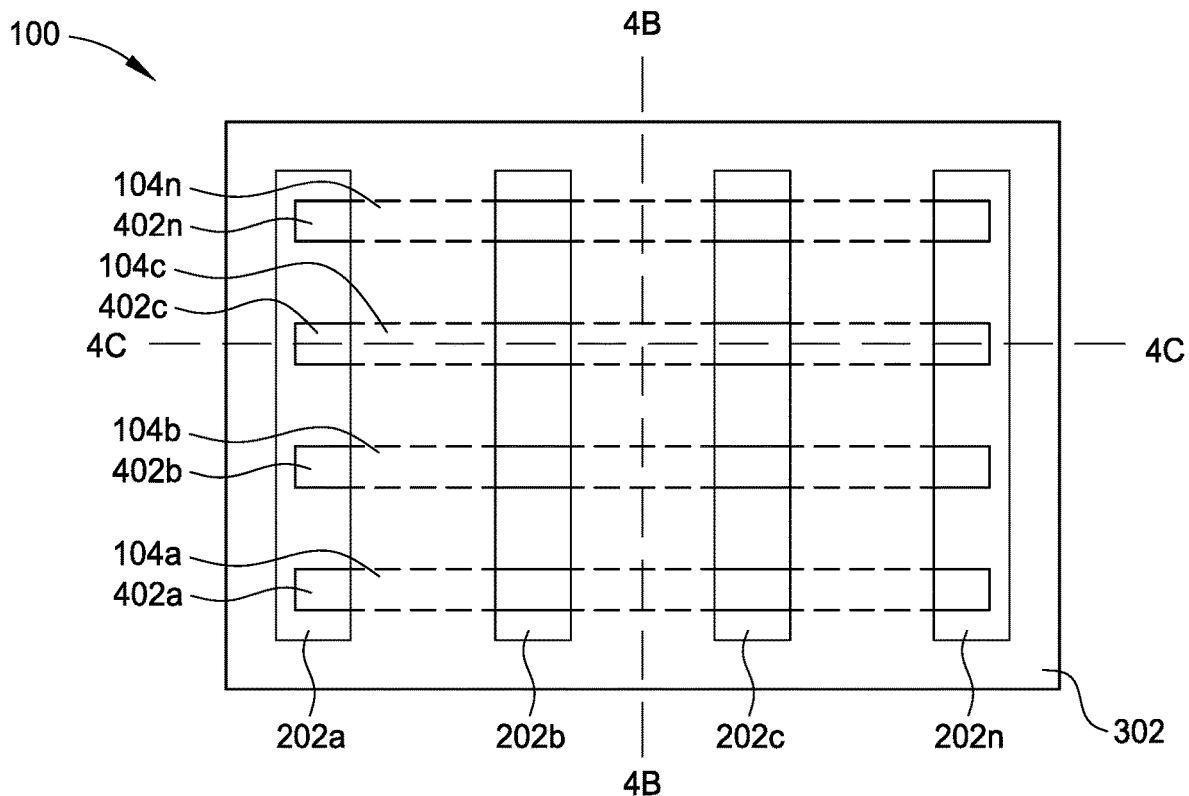
FIG. 4A is a top view of the semiconductor device of FIG. 3A after removing the dummy gates to form recesses.
Figure 4B:
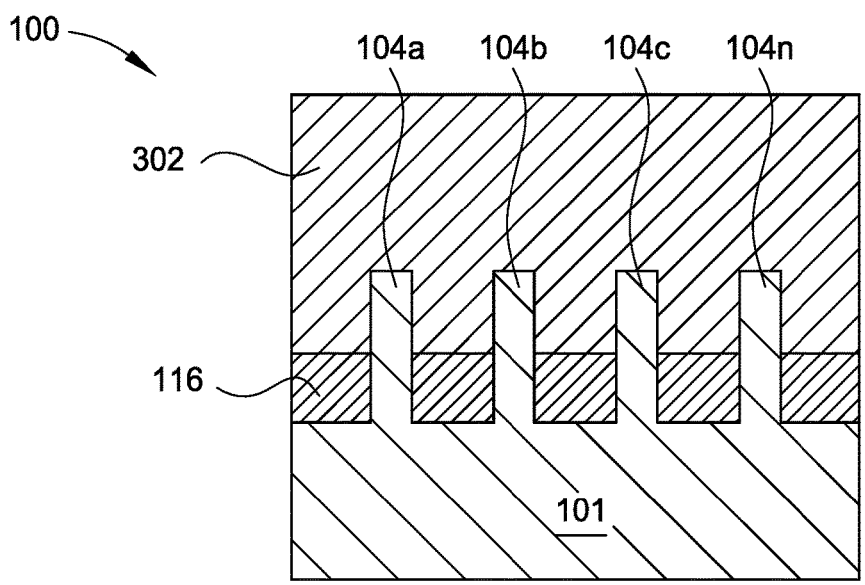
FIG. 4B is a cross-sectional view taken at section line 4B of FIG. 4A.
Figure 4C:
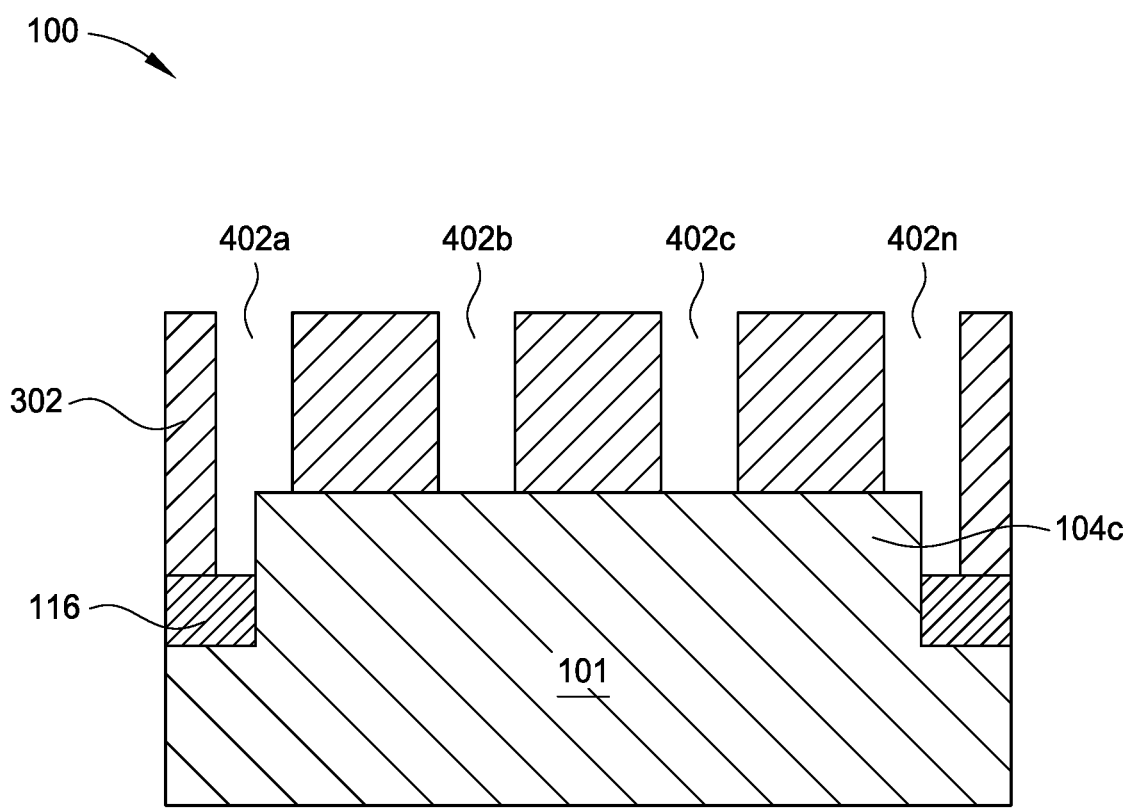
FIG. 4C is a cross-sectional view taken at section line 4C of FIG. 4A.

FIGS. 4A-4C are view of the semiconductor device 100 of FIG. 3A after removing the dummy gates 202a-202n to form recesses 402a-402n. The dummy gates are removed by a selective etch process, such as reactive ion etch (RIE). The selective etch removes the dummy gates 202a-202n but leaves the remaining structure intact.

Figure 5A:
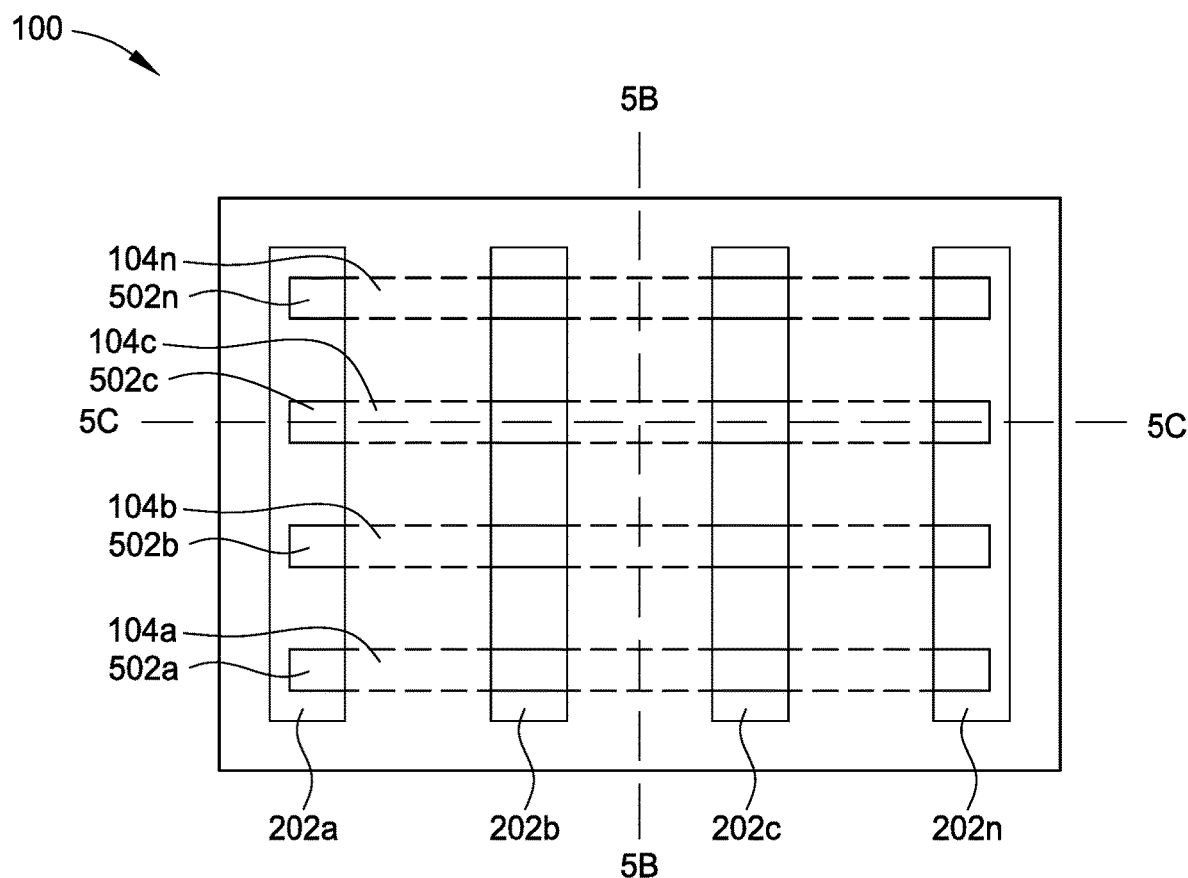
FIG. 5A is a top view of the semiconductor device of FIG. 4A having portions of the fin structures etched away such to form recesses overlying channel stop layers.
Figure 5B:
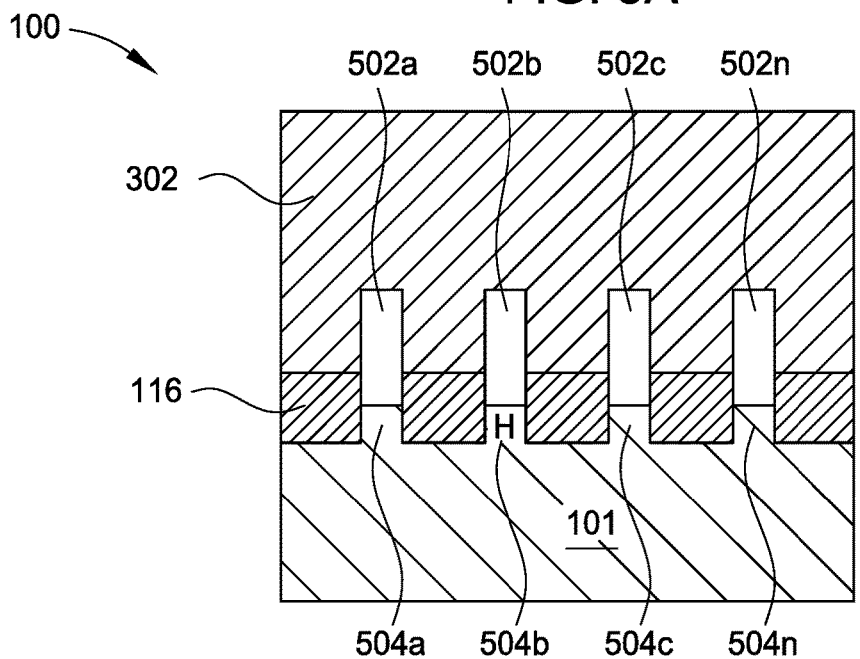
FIG. 5B is a cross-sectional view taken at section line 5B of FIG. 5A.
Figure 5C:
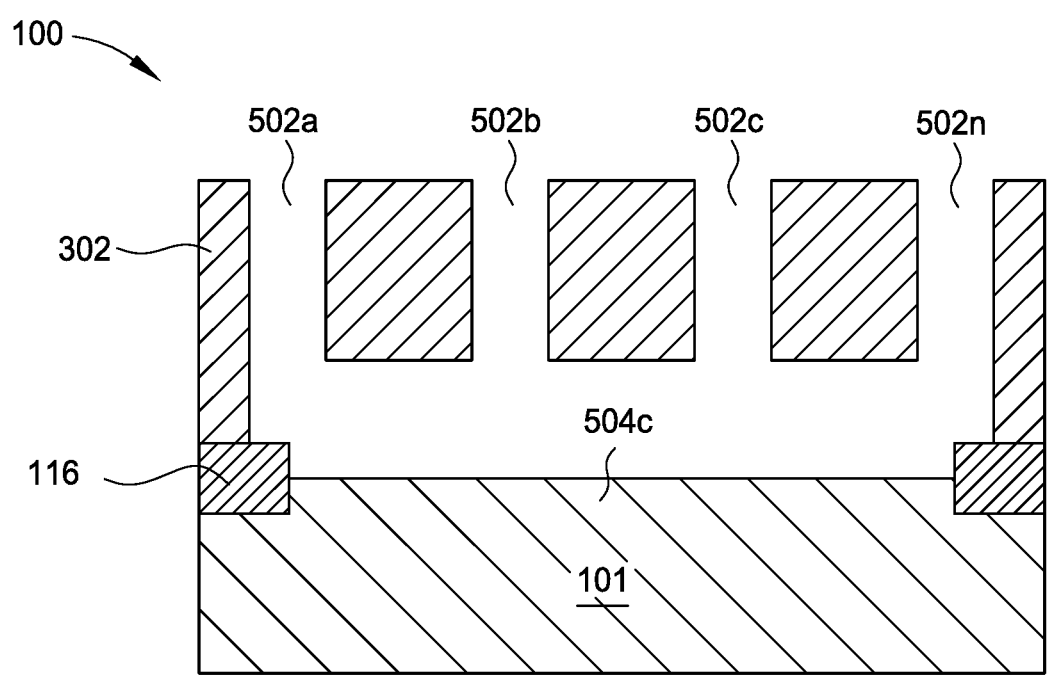
FIG. 5C is a cross-sectional view taken at section line 5C of FIG. 5A.

FIGS. 5A-5C are views of the semiconductor device 100 of FIG. 4A having portions of the fin structures 104a-104n etched away such to form recesses 502a-502n overlying channel stop layers 504a-504n. A surface of the remaining channel stop layers 504a-504n has a preferred (111) orientation of the crystalline structure, although other orientation is possible. The etch process may be a wet etch. The height H of the channel stop layers 504a-504n is in the range of 100 nm to 200 nm, although other height is possible. The recesses 502a-502n are where transistors are to be grown in the structure.

Figure 6A:
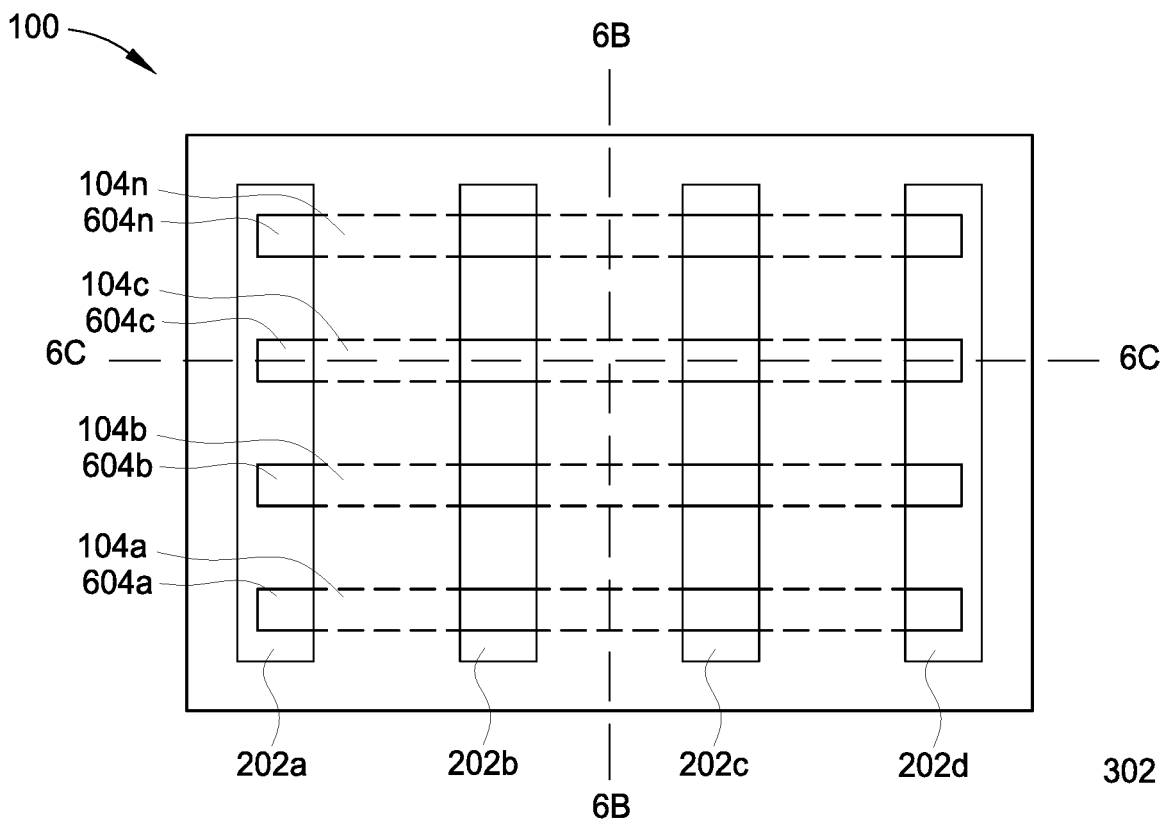
FIG. 6A is a top view of the semiconductor device of FIG. 5A after epitaxially growing pairs of alternating nanosheets of active transistor channels and nanosheets of dummy channels.
Figure 6B:
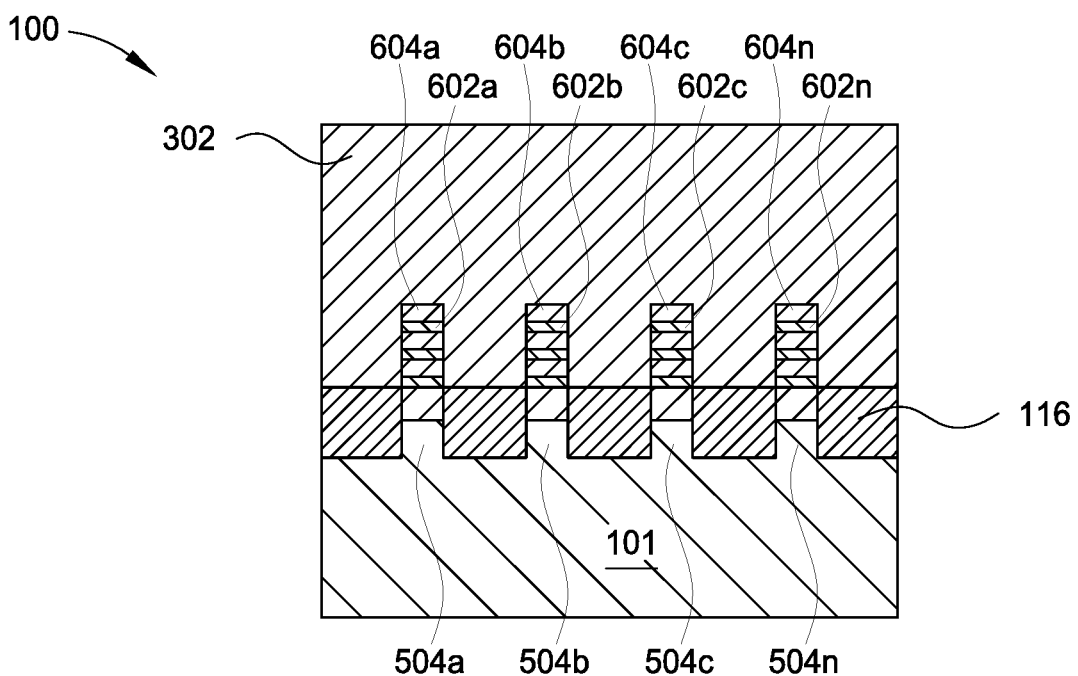
FIG. 6B is a cross-sectional view taken at section line 6B of FIG. 6A.
Figure 6C:
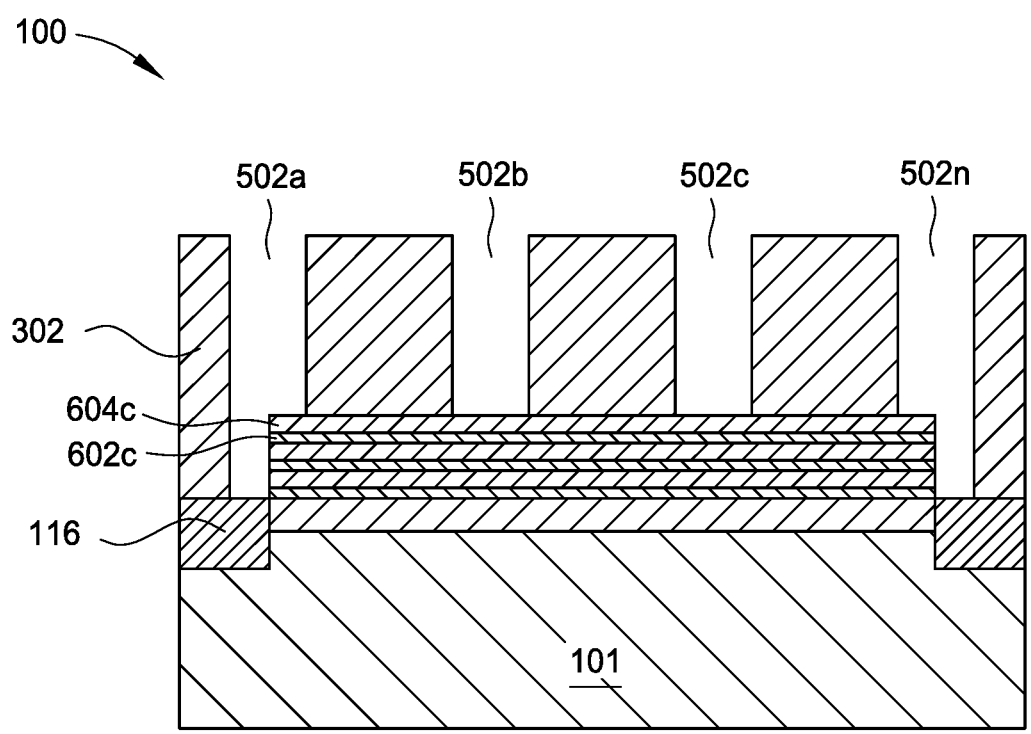
FIG. 6C is a cross-sectional view taken at section line 6C of FIG. 6A.

FIGS. 6A-6C are views of the semiconductor device 100 of FIG. 5A after epitaxially growing pairs of alternating nanosheets of active transistor channels 602a-602n and nanosheets of dummy channels 604a-604n. The alternating nanosheets 602a-602n, 604a-604n are grown within and between the recesses 502a-502n left by the removed dummy gates 202a-202n.

The underlying nanosheets of the active transistor channels 602a-602n act as seed crystals. Epitaxial layers may be grown from gaseous or liquid precursors. The epitaxial active transistor channels 602a-602n may be a III-V material such as InGaAs and the dummy channels 604a-604n may be made from AlAs.

The epitaxial III-V material may be grown using vapor-phase epitaxy (VPE), molecular-beam epitaxy (MBE), liquid-phase epitaxy (LPE), or other suitable process. The epitaxial III-V material of the active transistor channels 602a-602n may be doped during deposition by adding a dopant or impurity. The III-V material of the active transistor channels 602a-602n may be doped with an n-type dopant (e.g., phosphorus or arsenic) or a p-type dopant (e.g., boron or gallium), depending on the type of device.

Figure 7A:
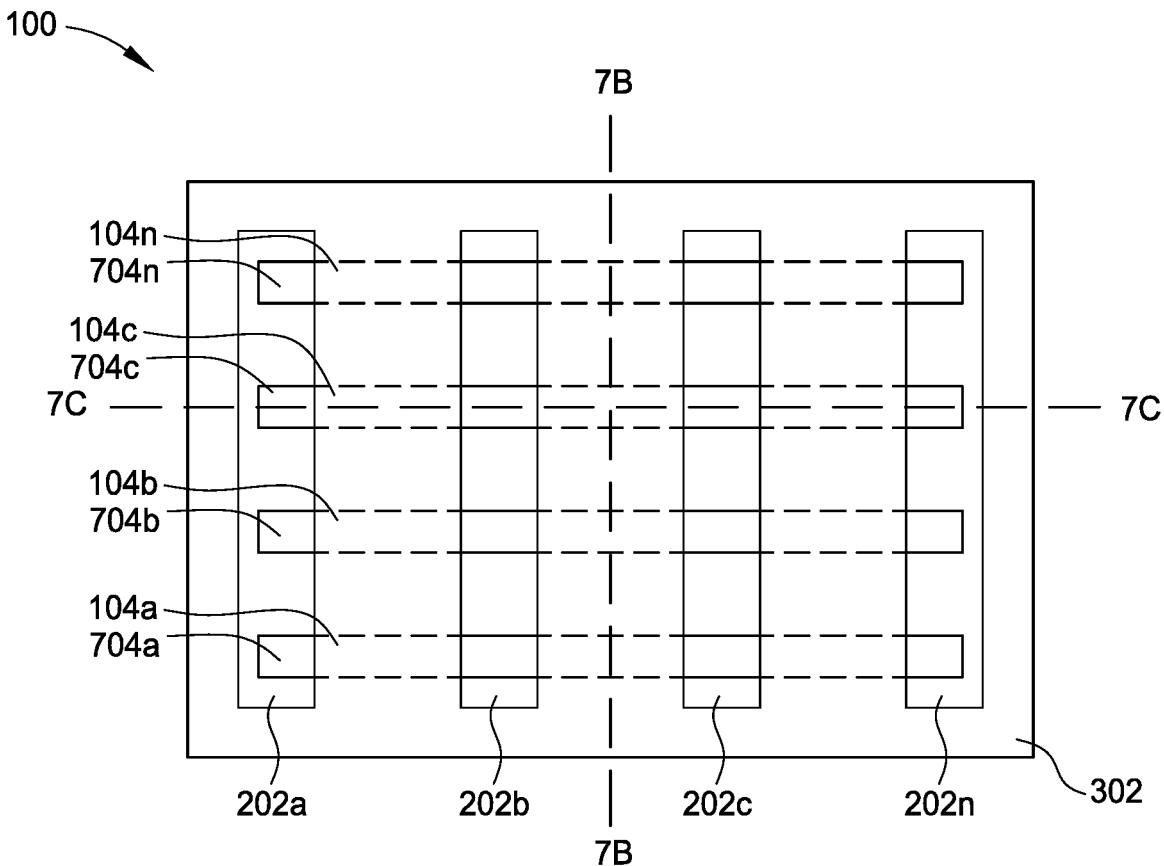
FIG. 7A is a top view of the semiconductor device of FIG. 6A after oxidizing the dummy nanosheet channels at room or elevated temperatures to produce $AlO_3$ dummy channels alternating with the active transistor channels.
Figure 7B:
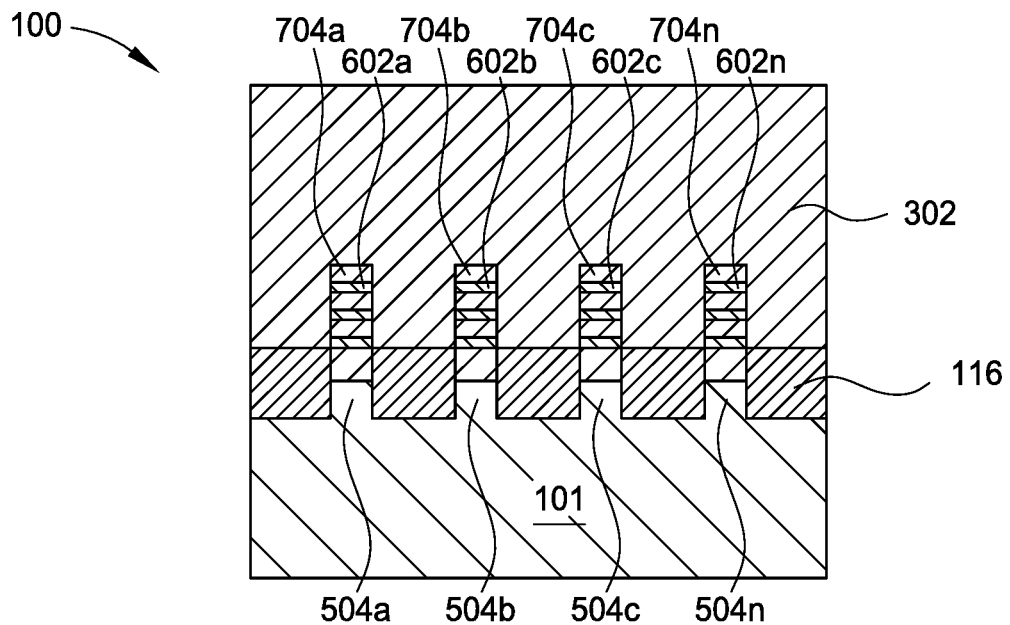
FIG. 7B is a cross-sectional view taken at section line 7B of FIG. 7A.
Figure 7C:
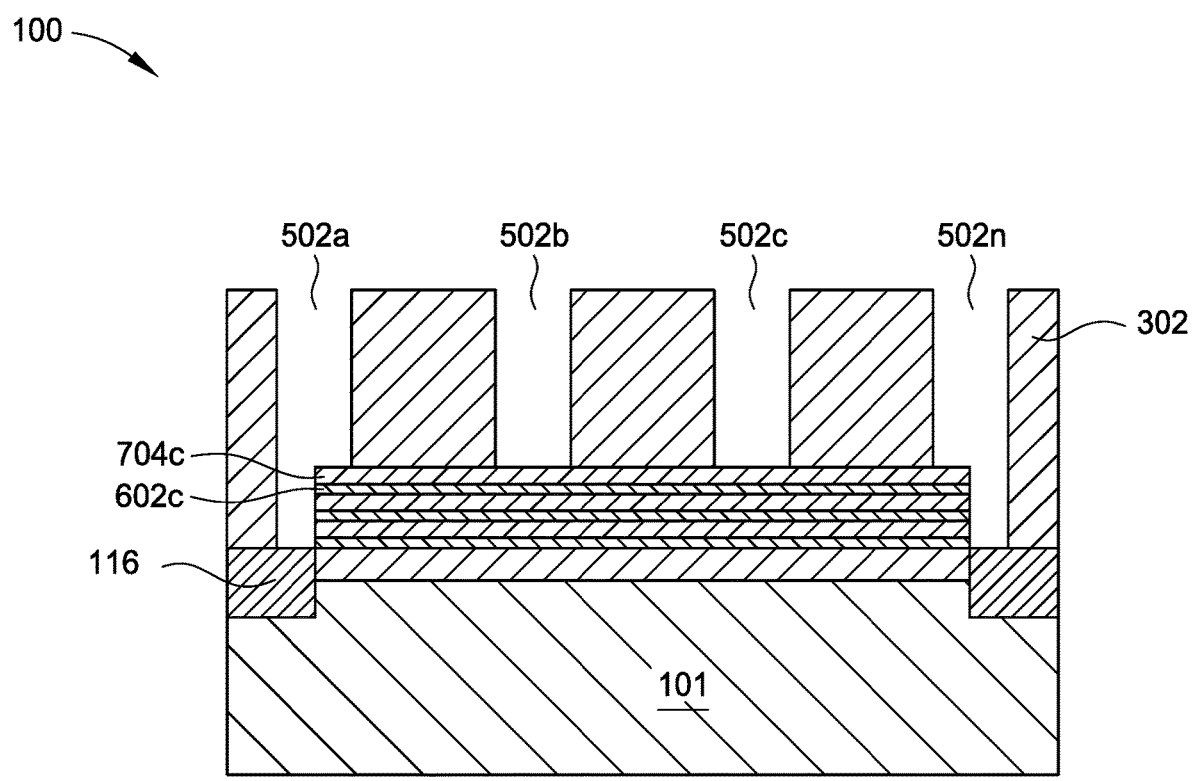
FIG. 7C is a cross-sectional view taken at section line 7C of FIG. 7A.

FIGS. 7A-7C are views of the semiconductor device 100 of FIG. 6A after oxidizing the dummy nanosheet channels 604a-604n at room or elevated temperatures to produce $AlO_3$ dummy channels 704a-704n alternating with the active transistor channels 602a-602n.

FIGS. 8A-8D are views of the semiconductor device 100 of FIG. 7A after removing portions of the dummy nanosheet channels 804a-804n to form remaining portions of the dummy sheet channels 806a-806n having a width equal to that of the channel stop layers 504a-504n and recesses 802a-802n that expose the active transistor channels 702a-702n in the recesses 802a-802n. A selective isotropic etch process is applied to form the vertically arranged active transistor channels 702a-702n.

Figure 8A:
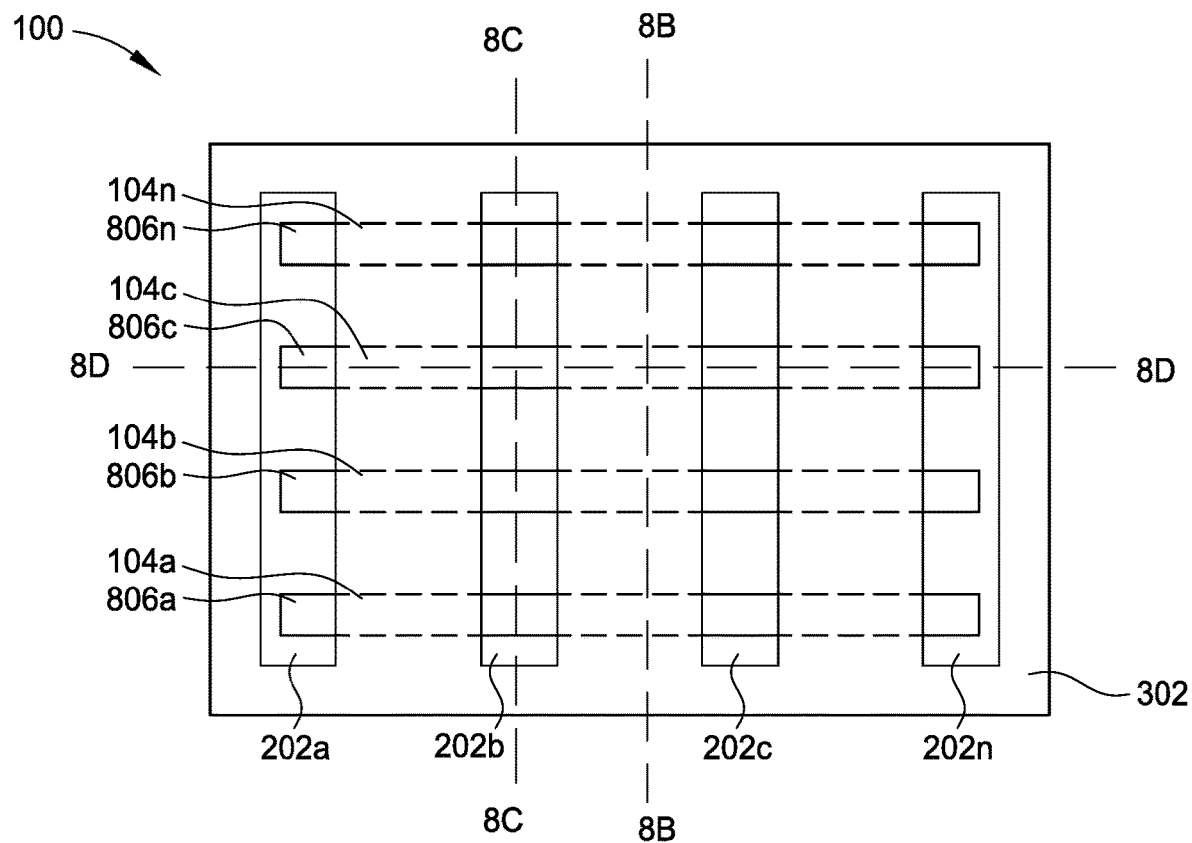
FIG. 8A is a top view of the semiconductor device of FIG. 7A after removing portions of the dummy nanosheet channels to form recesses that expose the active transistor channels in the recesses.
Figure 8B:
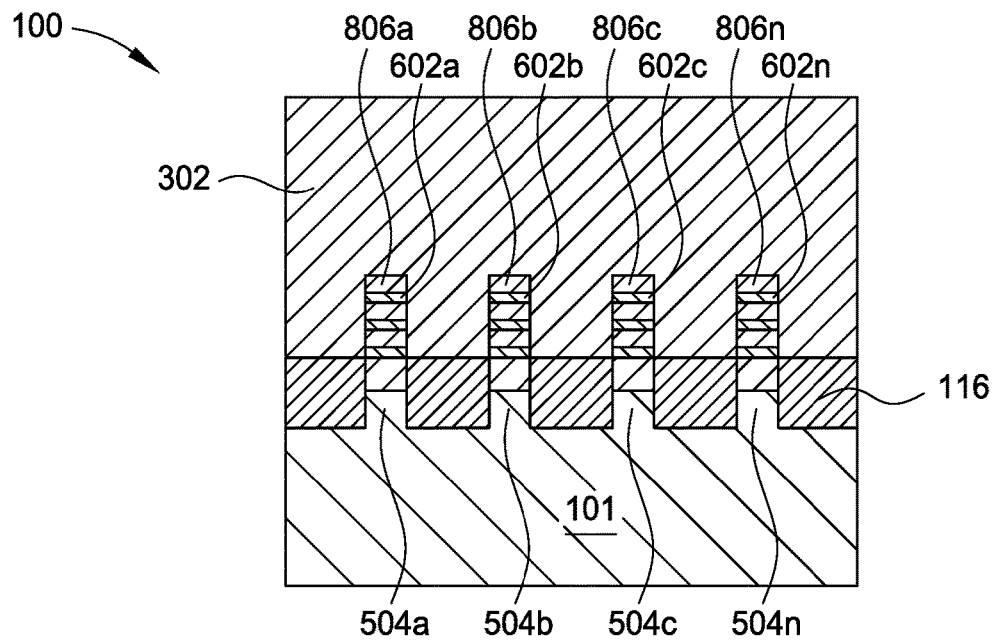
FIG. 8B is a cross-sectional view taken at section line 8B of FIG. 8A.
Figure 8C:
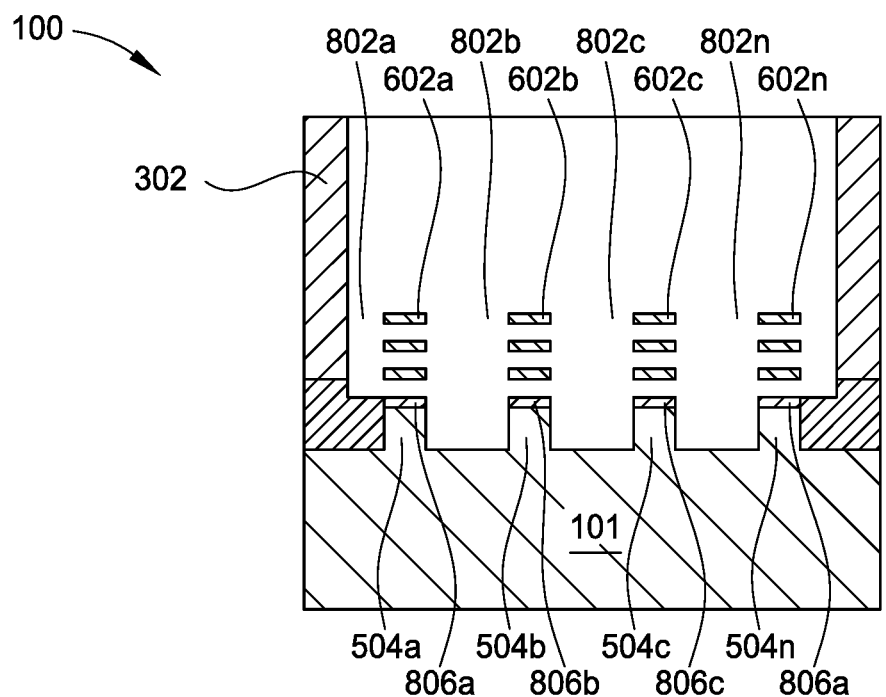
FIG. 8C is a cross-sectional view taken at section line 8C of FIG. 8A.
Figure 8D:
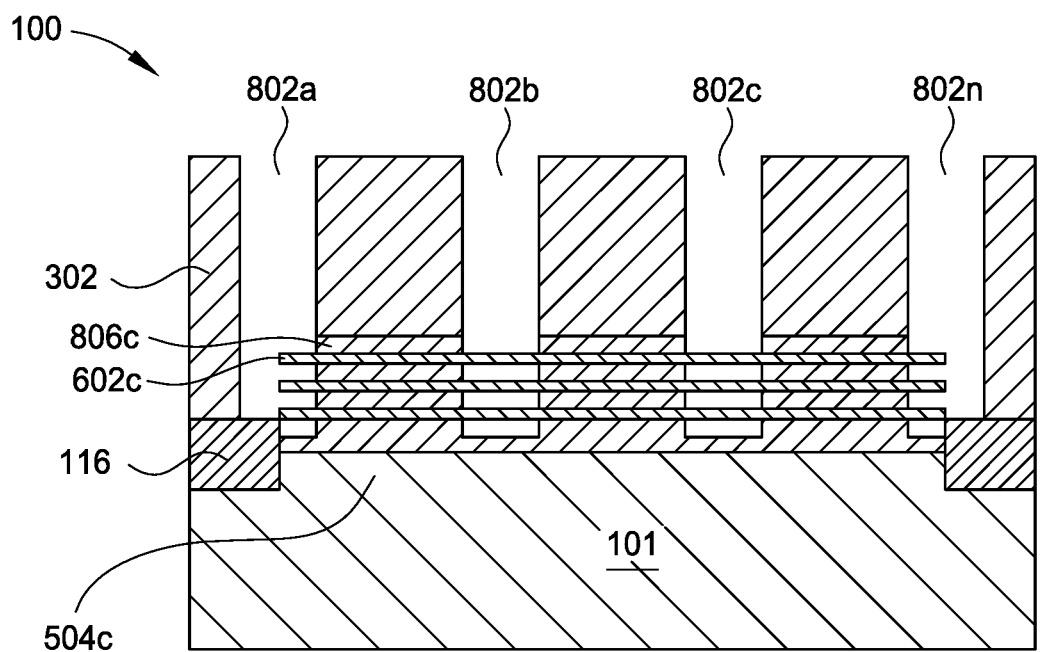
FIG. 8D is a cross-sectional view taken at section line 8D of FIG. 8A.

FIGS. 9A-9D are views of the semiconductor device 100 of FIG. 8A after depositing a high-k dielectric gate layer 902 in the recesses 802a-802n. A silicon cap layer 904 is deposited overlying the high-k dielectric gate layer 902. A high-k dielectric gate layer 902 may be conformally deposited on the recesses 802a-802n by any suitable deposition technique known in the art, for example: by atomic layer deposition (ALD), chemical vapor deposition (CVD), plasma-enhanced chemical vapor deposition (PECVD), high-density CVD (HDCVD), physical vapor deposition (PVD), plating, sputtering, evaporation, and chemical solution deposition of a high-k dielectric material. The high-k dielectric gate layer 902 may include a thickness ranging from about 1 nm to about 5 nm. In one embodiment, the high-k dielectric gate layer 902 may include a high-k dielectric material having a dielectric constant greater than, for example, 3.9, which is the dielectric constant of silicon oxide.

Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

A conductive metal cap layer 904 is deposited over the high-k dielectric gate layer 902 to form the gate stacks 906. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

After depositing the high-k dielectric gate layer 902 and the conductive metal cap layer 904, the semiconductor structure 100 may be subjected to a planarization process to remove excess material from the top of the semiconductor structure 100. The planarization process may be conducted using any polishing technique known in the art such as for example: chemical mechanical polishing (CMP).

Figure 9A:
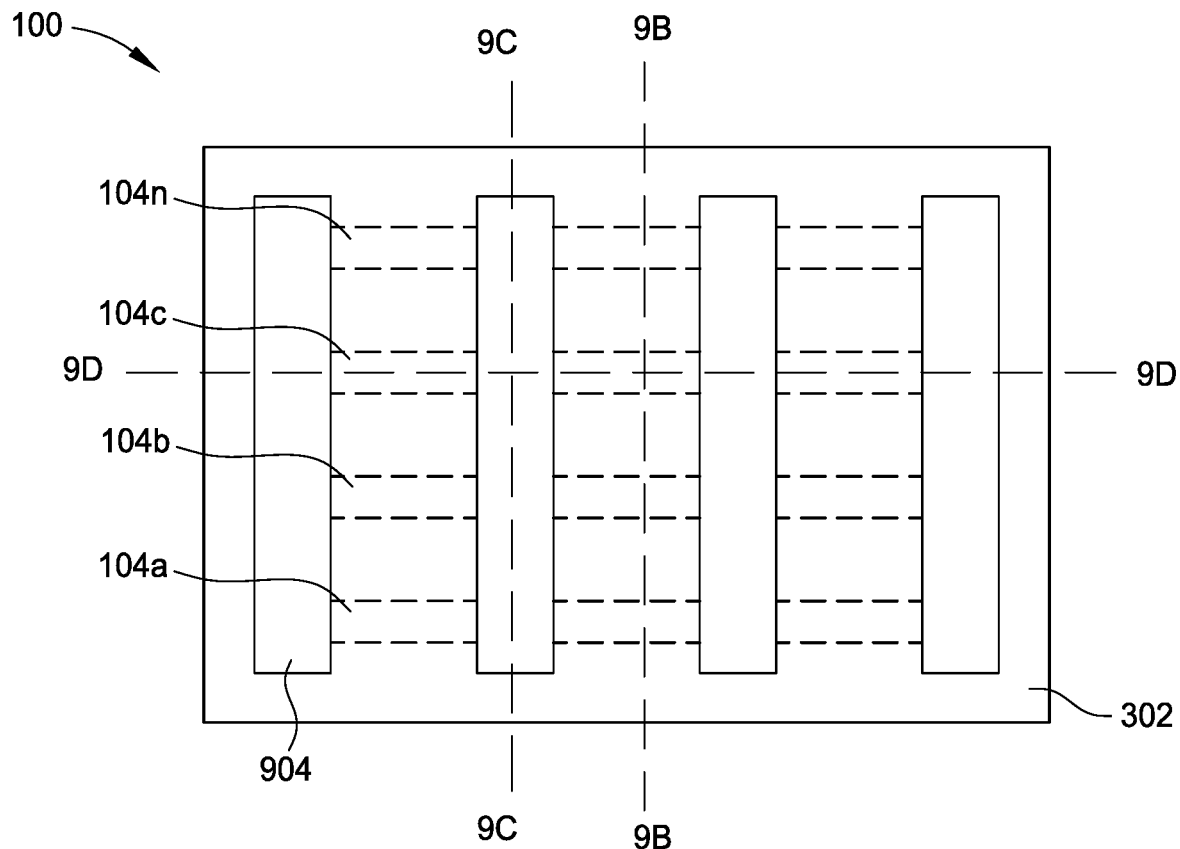
FIG. 9A is a top view of the semiconductor device of FIG. 8A after depositing a high-k dielectric gate layer in the recesses.
Figure 9B:
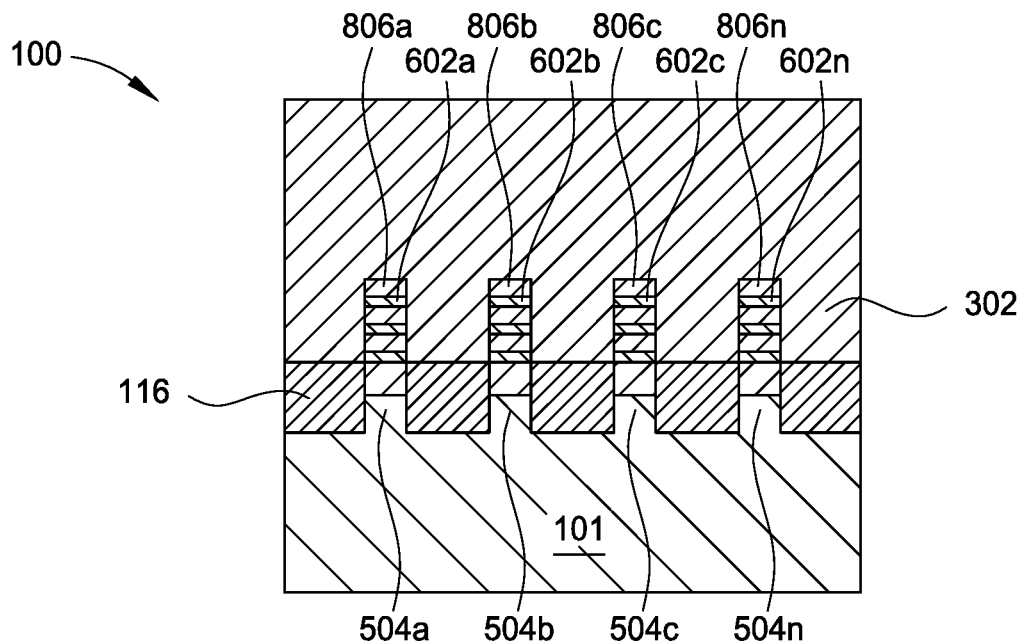
FIG. 9B is a cross-sectional view taken at section line 9B of FIG. 9A.
Figure 9C:
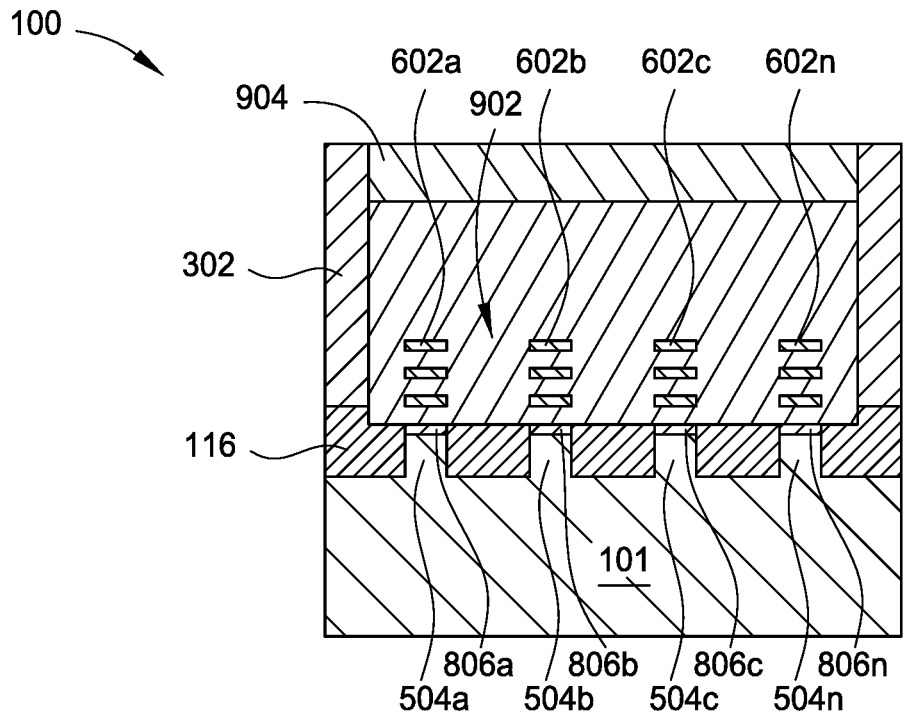
FIG. 9C is a cross-sectional view taken at section line 9D of FIG. 9A.
Figure 9D:
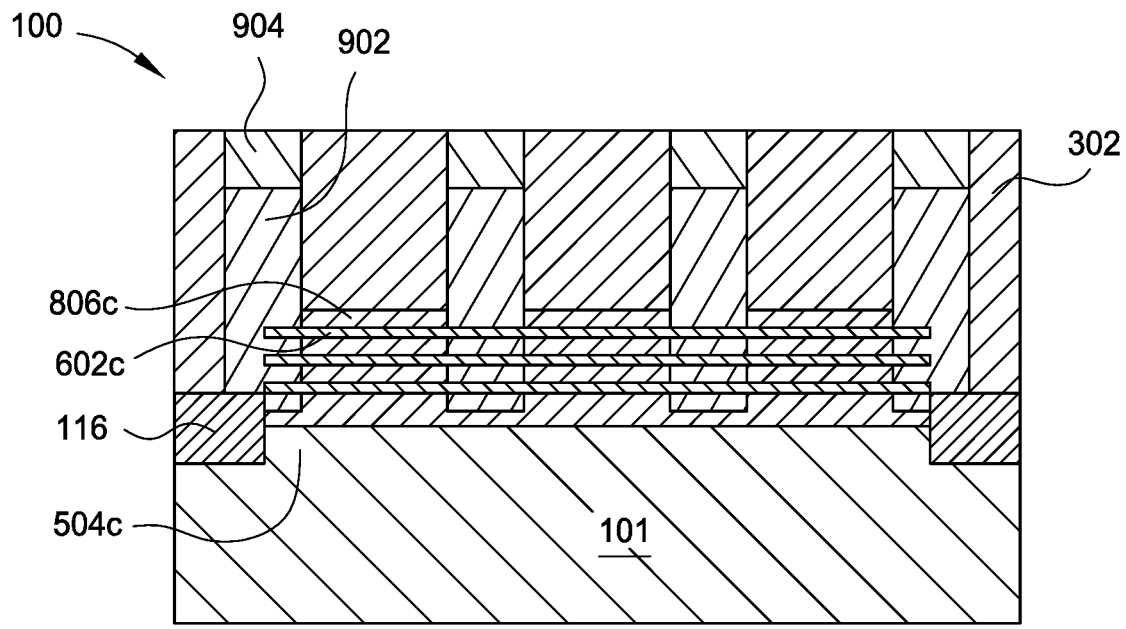
FIG. 9D is a cross-sectional view taken at section line 9C of FIG. 9A.

FIGS. 10A-10D are views of the semiconductor device 100 of FIG. 9A after removing a portion of insulator 302 to form recesses 1002a-1002n for later forming source and drain contacts.

Figure 10A:
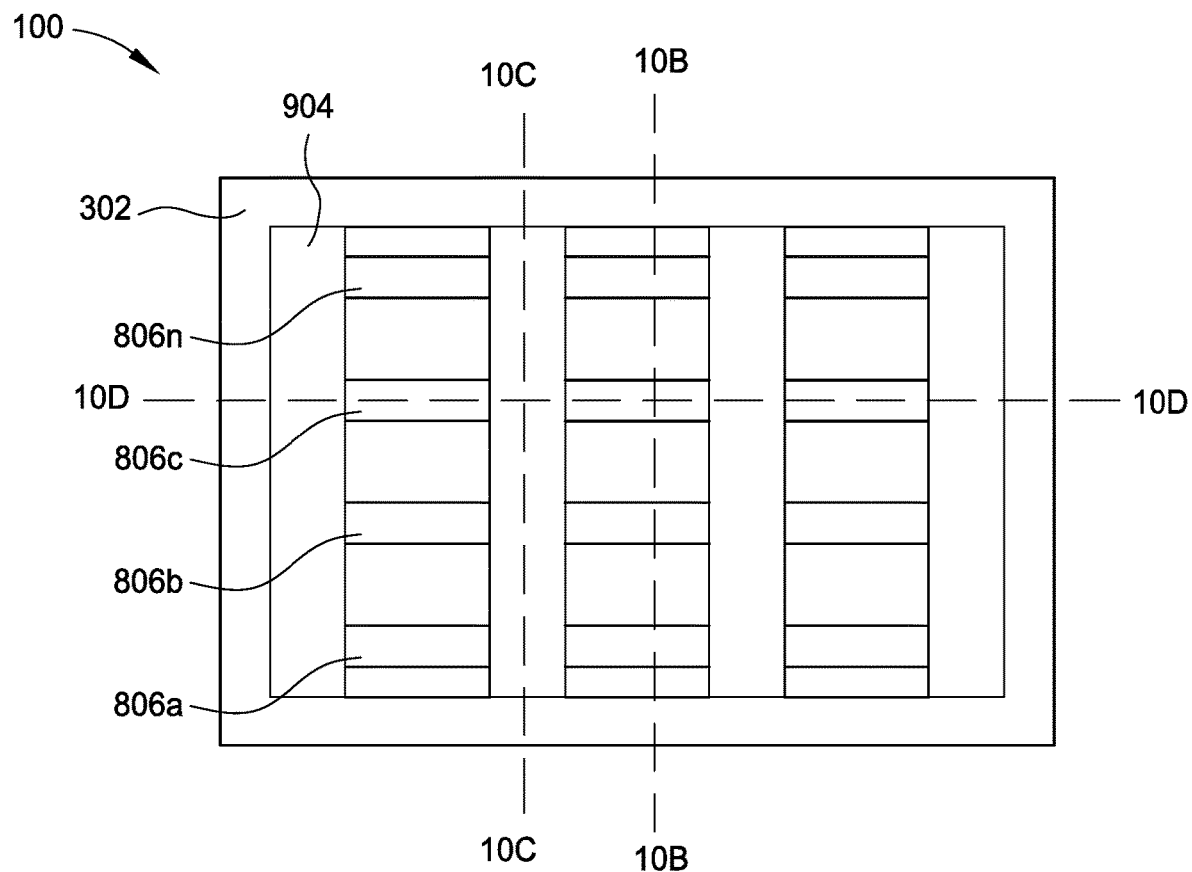
FIG. 10A is a top view of the semiconductor device of FIG. 9A after removing portions of the high-k dielectric gate layer and the conductive metal cap layer to form recesses for later forming source and drain contacts.
Figure 10B:
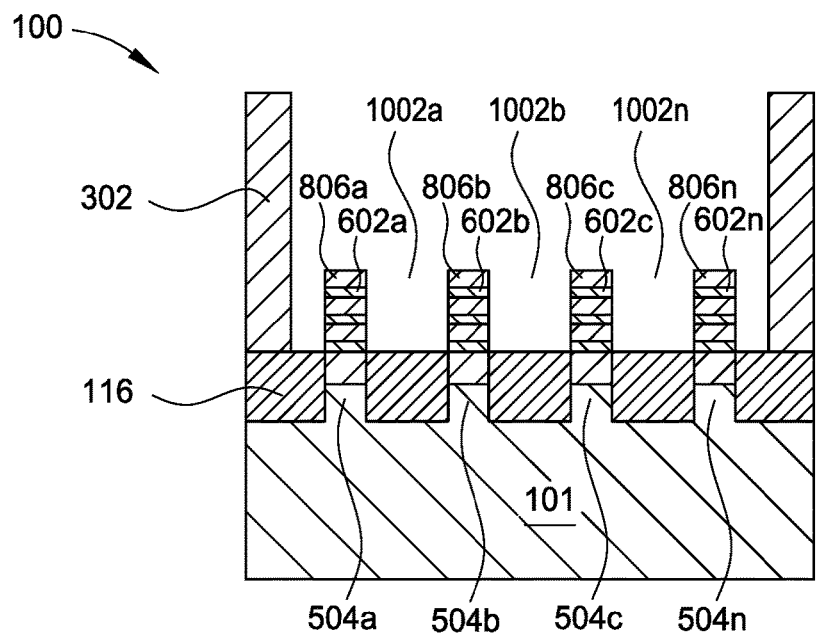
FIG. 10B is a cross-sectional view taken at section line 10B of FIG. 10A.
Figure 10C:
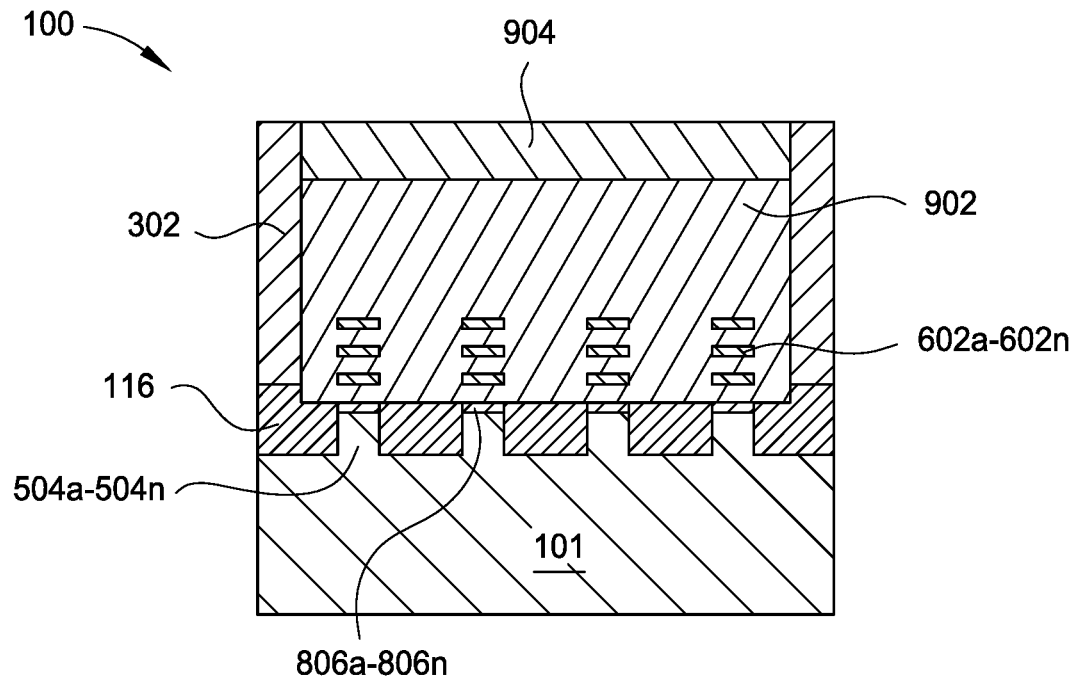
FIG. 10C is a cross-sectional view taken at section line 10D of FIG. 10A.
Figure 10D:
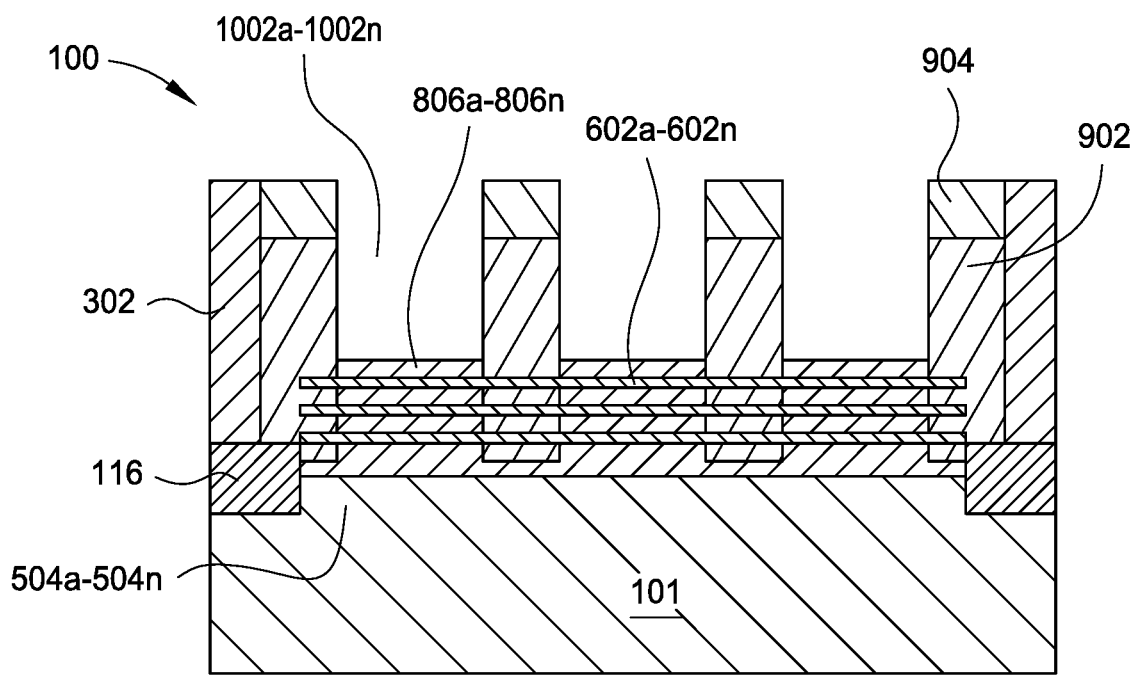
FIG. 10D is a cross-sectional view taken at section line 10C of FIG. 10A.

FIGS. 11A-11D are views of the semiconductor device 100 of FIG. 10A after forming dielectric spacers 1102a-1102n along the sidewalls 1104a-1104n left in the recesses 1002a-1002n left by the removed portions of the high-k dielectric gate layer 902 and the conductive metal cap layer 904. The dielectric spacers 1102a-1102n can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

Figure 11A:
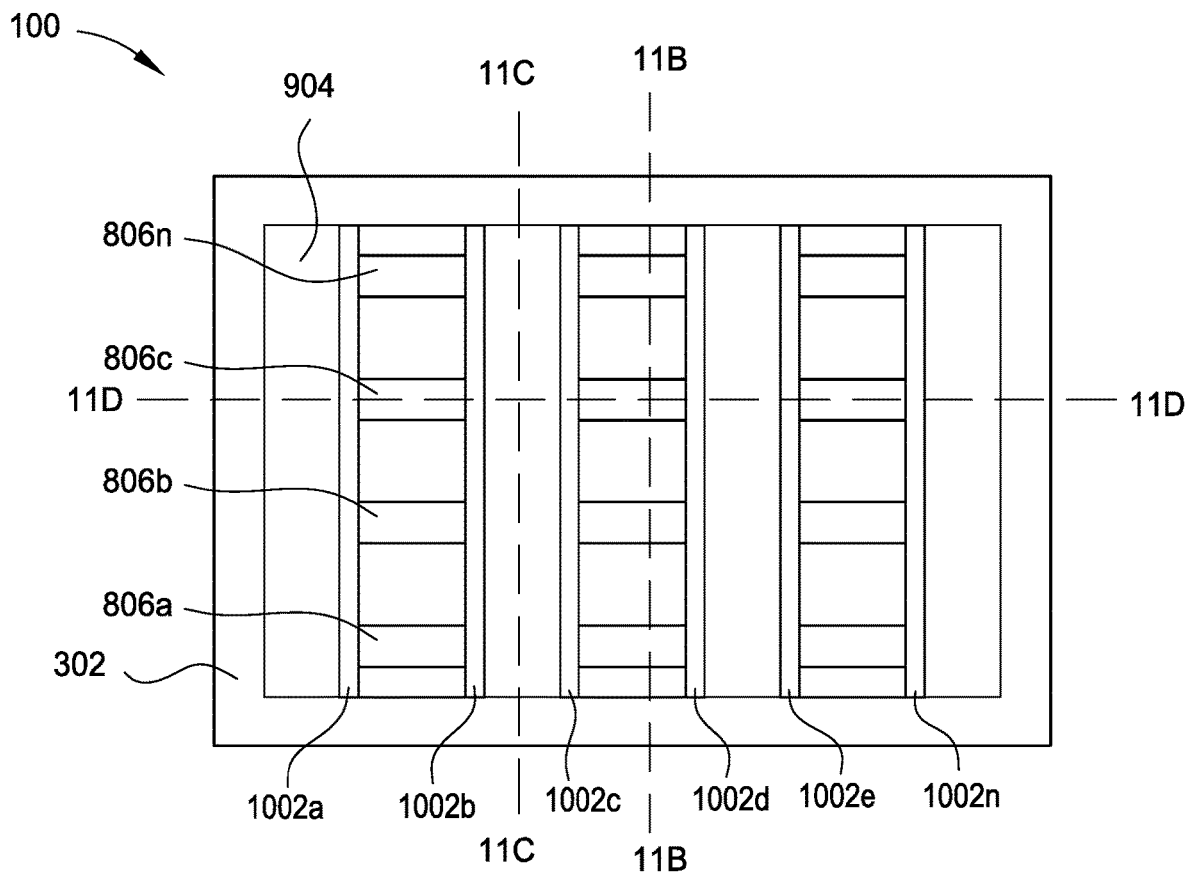
FIG. 11A is a top view of the semiconductor device of FIG. 10A after forming dielectric spacers along the sidewalls left in the recesses left by the removed portions of the high-k dielectric gate layer and the conductive metal cap layer.
Figure 11B:
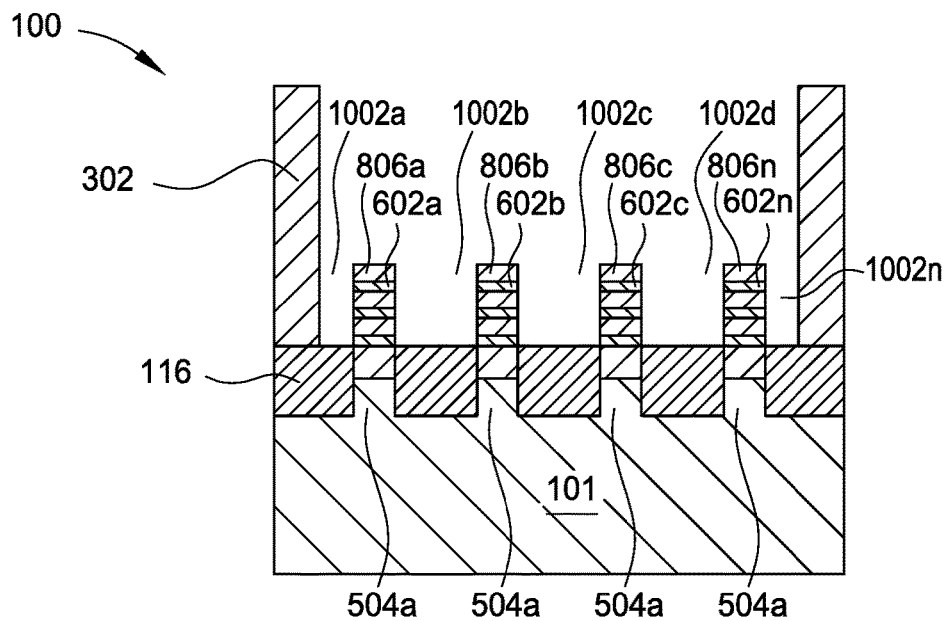
FIG. 11B is a cross-sectional view taken at section line 11B of FIG. 11A.
Figure 11C:
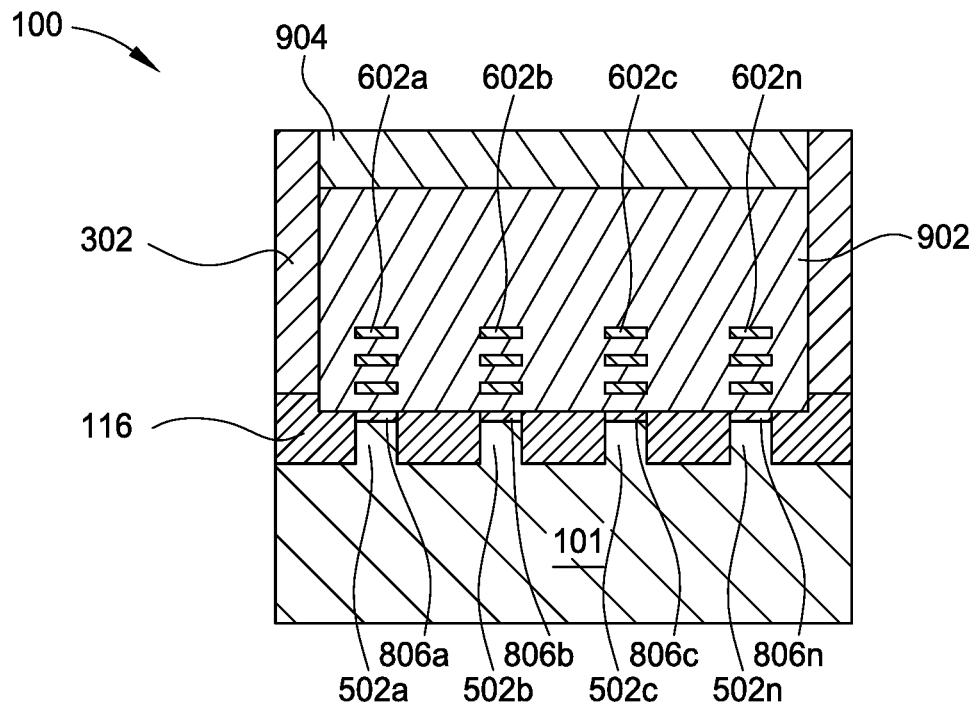
FIG. 11C is a cross-sectional view taken at section line 11D of FIG. 10A.
Figure 11D:
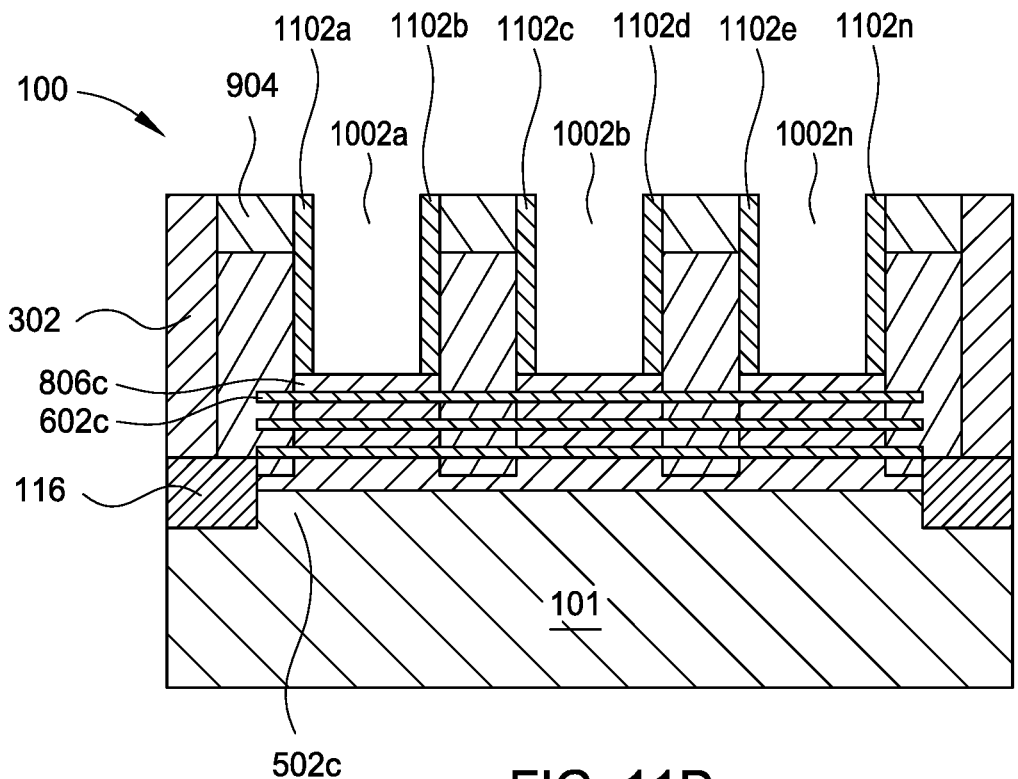
FIG. 11D is a cross-sectional view taken at section line 11C of FIG. 10A.

FIGS. 12A-12D are views of the semiconductor device 100 of FIG. 11A after epitaxially growing source/drain regions 1202a-1202n in the remaining recesses 1002a-1002n adjacent to the dielectric spacers 1102a-1102n. An epitaxy is preferably employed to form the source/drain regions 1202a-1202n, which may include a III-V material such as InGaAs. The source/drain regions 1202a-1022n may be highly doped by means of a diffusion process, or alternatively, by an ion implantation process.

Figure 12A:
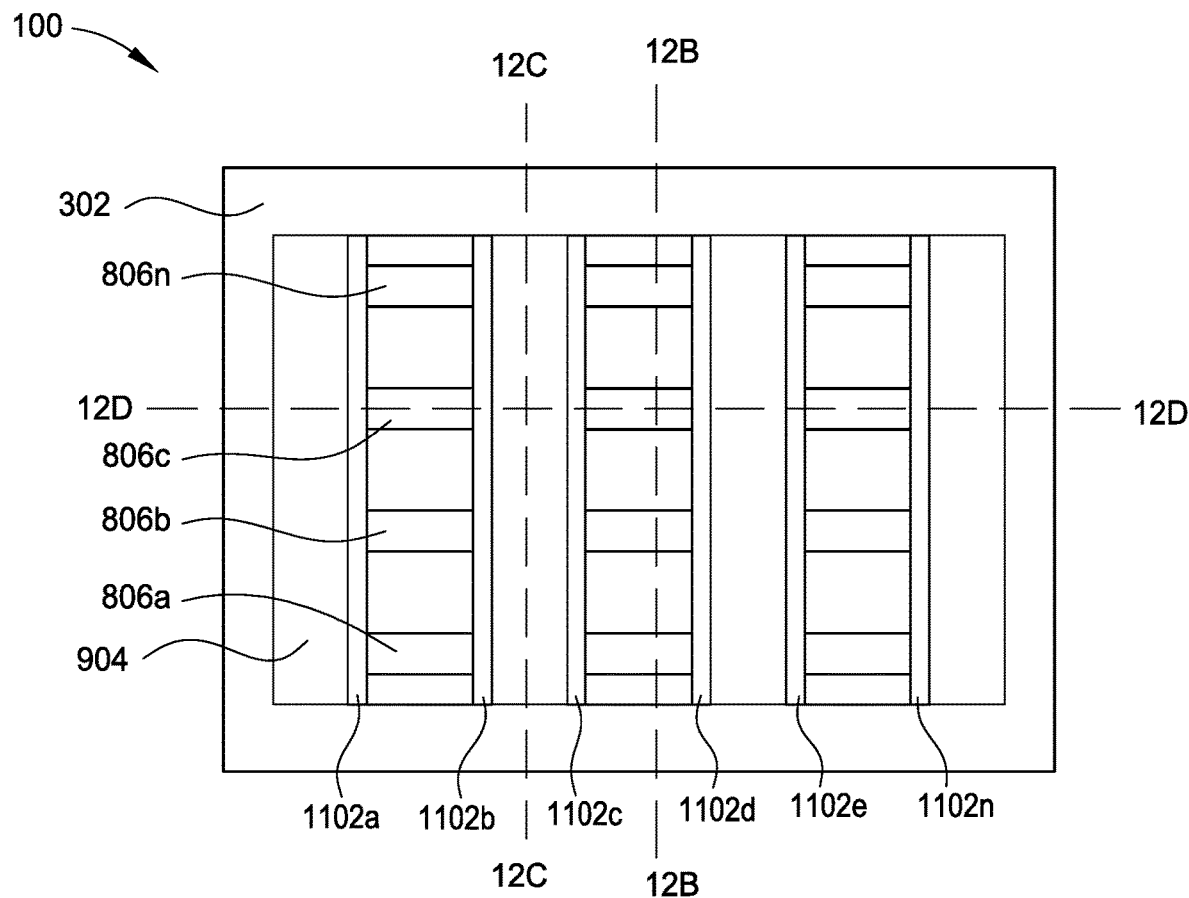
FIG. 12A is a top view of the semiconductor device of FIG. 11A after epitaxially growing source/drain regions in the remaining recesses adjacent to the dielectric spacers.
Figure 12B:
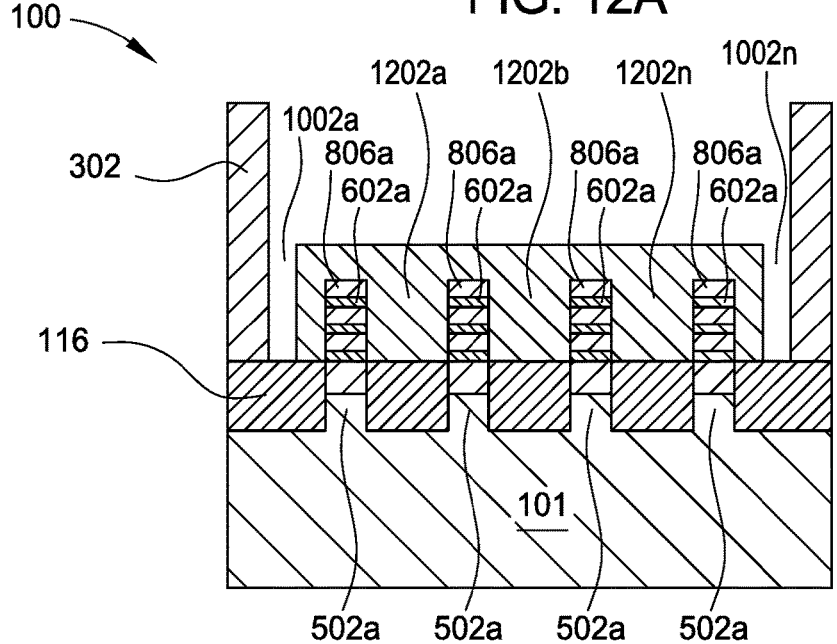
FIG. 12B is a cross-sectional view taken at section line 12B of FIG. 12A.
Figure 12C:
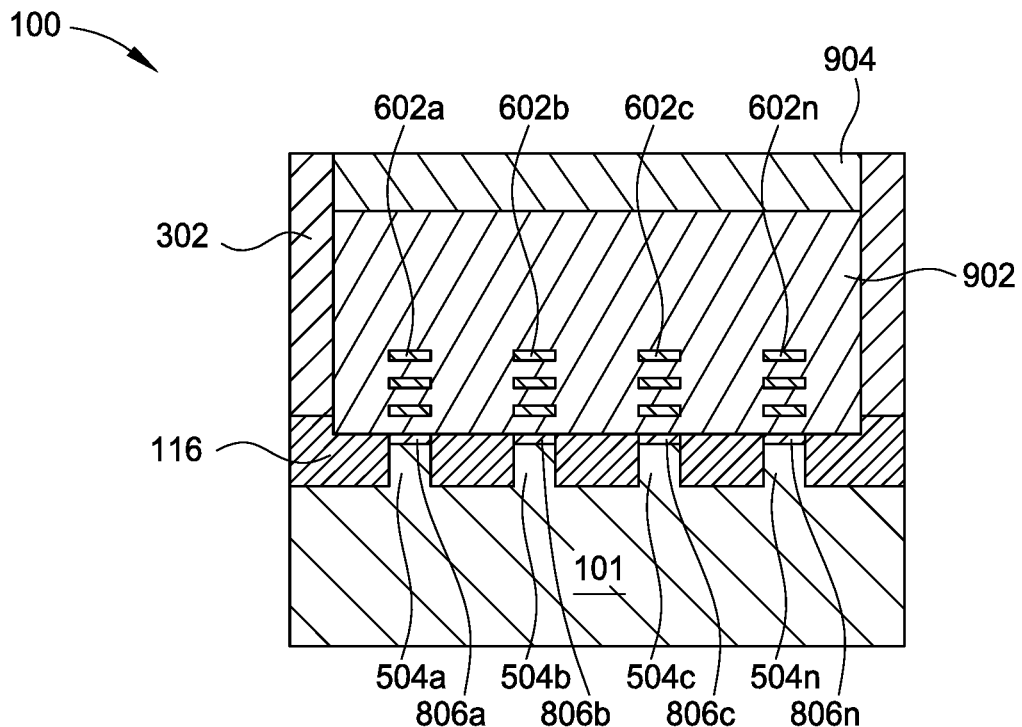
FIG. 12C is a cross-sectional view taken at section line 12D of FIG. 12A.
Figure 12D:
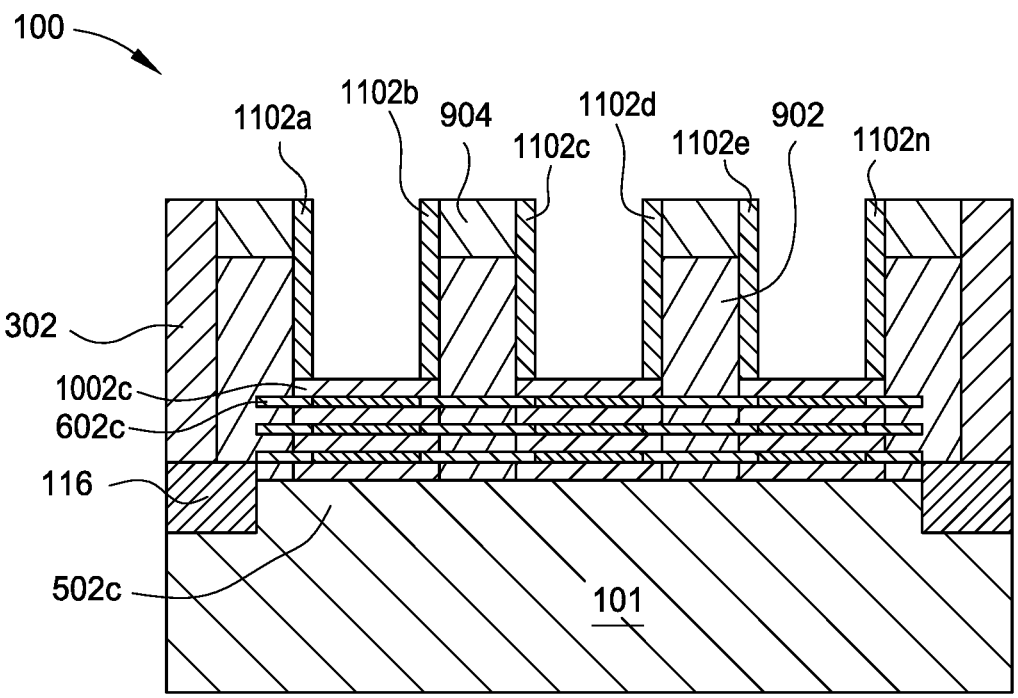
FIG. 12D is a cross-sectional view taken at section line 1C of FIG. 12A.
Figure 13A:
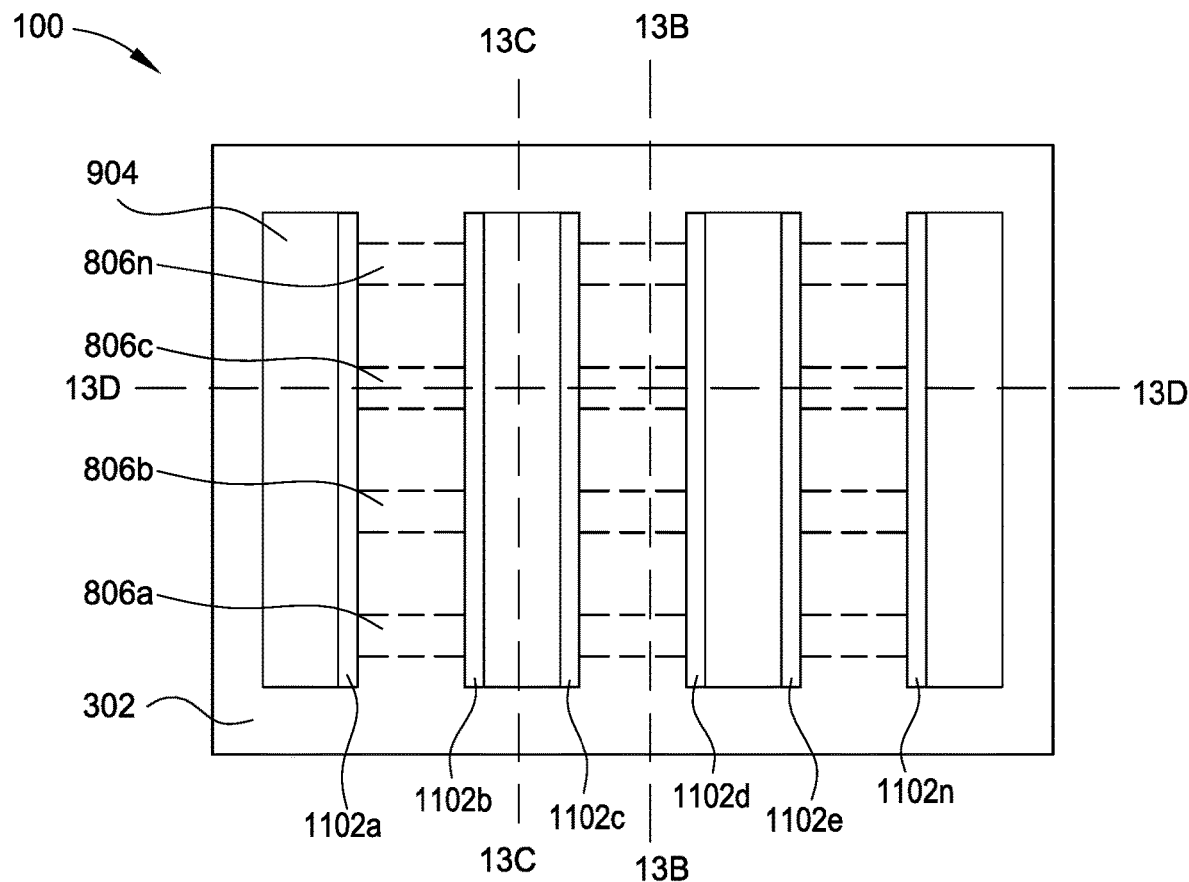
FIG. 13A is a top view of the semiconductor device of FIG. 12A after forming source/drain metal contacts overlying the source/drain regions.
Figure 13B:
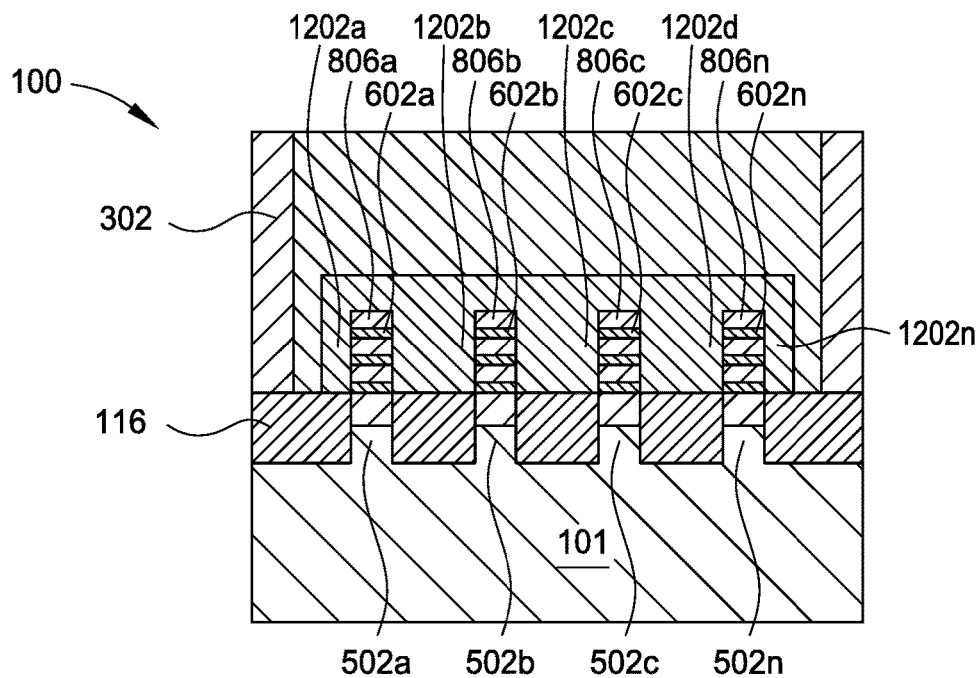
FIG. 13B is a cross-sectional view taken at section line 13B of FIG. 13A.
Figure 13C:
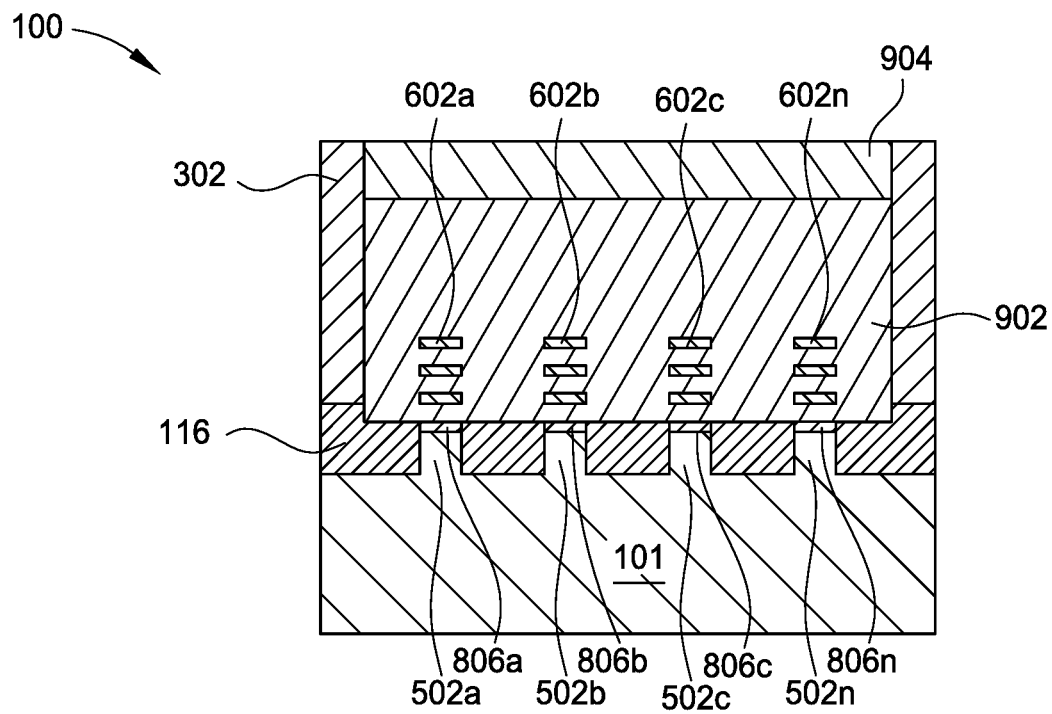
FIG. 13C is a cross-sectional view taken at section line 13D of FIG. 13A.
Figure 13D:
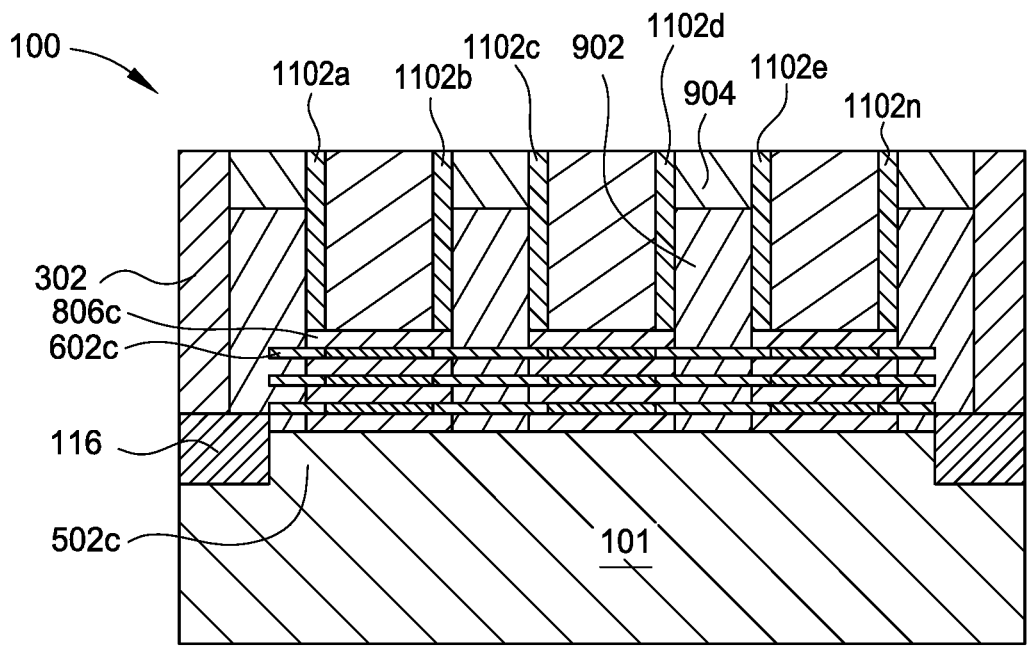
FIG. 13D is a cross-sectional view taken at section line 13C of FIG. 13A.

FIGS. 13A-13D are views the semiconductor device 100 of FIG. 12A after forming source/drain metal contacts 1302a-1302n in the recesses 1002a-1002n overlying the source/drain regions 1202a-1202n. The source/drain metal contact may be made of Tungsten. The metal contacts 1302a-1302n may include a liner (not shown). The metal contacts 1302a-1302n provide electrical connections to the device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A method for fabricating a semiconductor device, comprising:
    forming a plurality of dummy dielectric layers separated by a corresponding plurality of source/drain regions overlying a substrate;
    forming one or more nanosheets of active transistor channels alternating between the plurality of dummy dielectric layers and extending at least part way into the plurality of source/drain regions;
    forming a high-k dielectric layer overlying portions of the one or more nanosheets not covered by the plurality of dummy dielectric layers; and
    forming a conductive metal cap layer overlying the high-k dielectric layer.

2. The method of claim 1, further comprising forming a plurality of etch stop layers overlying the substrate and underlying and aligned with the plurality of dummy layers.

3. The method of claim 2, wherein forming the plurality of etch stop layers comprises forming a plurality of fin structures overlying the substrate.

4. The method of claim 3, further comprising forming a shallow trench isolation (STI) layer overlying a surface of the substrate proximal to but not including the fin structures.

5. The method of claim 4, wherein the III-V material is InGaAs.

6. The method of claim 4, wherein forming one or more nanosheets of active transistor channels comprises epitaxially growing the one or more nanosheets of active transistor channels.

7. The method of claim 3, further comprising:
    forming a plurality of dummy gates overlying a portion of the fin structures;
    removing the plurality of dummy gates to form first recesses; and
    etching portions of the fin structures to form second recesses overlying remaining portions of the fin structures to form the channel stop layers.

8. The method of claim 1, wherein the one or more nanosheets of active transistor channels are grown within and between the first recesses left by the removed dummy gates.

9. The method of claim 1, wherein the one or more nanosheets are aligned in a (1, 1, 1) orientation of the substrate.

10. The method of claim 1, wherein the one or more nanosheets are made of a III-V material.

11. The method of claim 1, further comprising forming a plurality of dielectric spacers along sidewalls of the source/drain regions.

12. The method of claim 1, further comprising forming metal contacts in recesses overlying the source/drain regions.

* * * * *